United States Patent
Cheng et al.

(10) Patent No.: US 8,987,823 B2
(45) Date of Patent: Mar. 24, 2015

(54) METHOD AND STRUCTURE FOR FORMING A LOCALIZED SOI FINFET

(71) Applicant: International Business Machines Corporation, Armonk, NY (US)

(72) Inventors: Kangguo Cheng, Schenectady, NY (US); Ali Khakifirooz, Mountain View, CA (US); Kern Rim, Yorktown Heights, NY (US); Ramachandra Divakaruni, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/771,255

(22) Filed: Feb. 20, 2013

(65) Prior Publication Data

US 2014/0124863 A1 May 8, 2014

Related U.S. Application Data

(63) Continuation-in-part of application No. 13/670,768, filed on Nov. 7, 2012, now Pat. No. 8,766,363.

(51) Int. Cl.
H01L 27/12 (2006.01)
H01L 21/84 (2006.01)

(52) U.S. Cl.
CPC .......... *H01L 27/1207* (2013.01); *H01L 21/845* (2013.01)
USPC ....................................................... 257/350

(58) Field of Classification Search
USPC ....................................................... 257/350
See application file for complete search history.

(56) References Cited

U.S. PATENT DOCUMENTS

| | | | |
|---|---|---|---|
| 4,963,505 A * | 10/1990 | Fujii et al. ................. | 438/405 |
| 7,300,837 B2 | 11/2007 | Chen et al. | |
| 7,442,590 B2 | 10/2008 | Orlowski | |
| 7,807,517 B2 | 10/2010 | Kim et al. | |
| 7,871,873 B2 | 1/2011 | Maszara et al. | |
| 7,879,677 B2 | 2/2011 | Lee | |
| 7,898,040 B2 | 3/2011 | Nawaz | |
| 7,923,337 B2 | 4/2011 | Chang | |
| 7,977,174 B2 | 7/2011 | Luning et al. | |
| 8,017,463 B2 | 9/2011 | Chang | |

(Continued)

FOREIGN PATENT DOCUMENTS

KR  10-2011-0010383  2/2011

OTHER PUBLICATIONS

International Search Report/Written Opinion, FIS920120247; US2013/055034; Nov. 26, 2013.

*Primary Examiner* — Yu-Hsi D Sun
*Assistant Examiner* — Grant Withers
(74) *Attorney, Agent, or Firm* — Howard M. Cohn; Steven Meyers

(57) ABSTRACT

Methods and structures for forming a localized silicon-on-insulator (SOI) finFET are disclosed. Fins are formed on a bulk substrate. Nitride spacers protect the fin sidewalls. A shallow trench isolation region is deposited over the fins. An oxidation process causes oxygen to diffuse through the shallow trench isolation region and into the underlying silicon. The oxygen reacts with the silicon to form oxide, which provides electrical isolation for the fins. The shallow trench isolation region is in direct physical contact with the fins and/or the nitride spacers that are disposed on the fins. Structures comprising bulk-type fins, SOI-type fins, and planar regions are also disclosed.

9 Claims, 19 Drawing Sheets

(56) References Cited

U.S. PATENT DOCUMENTS

| | | |
|---|---|---|
| 8,106,459 B2 | 1/2012 | Chang et al. |
| 8,258,577 B2 | 9/2012 | Dixit |
| 8,513,723 B2 * | 8/2013 | Booth et al. ................. 257/306 |
| 2003/0193058 A1 * | 10/2003 | Fried et al. .................. 257/200 |
| 2006/0084212 A1 * | 4/2006 | Anderson et al. ............ 438/197 |
| 2007/0158756 A1 | 7/2007 | Dreeskornfeld et al. |
| 2008/0128797 A1 | 6/2008 | Dyer et al. |
| 2011/0012202 A1 * | 1/2011 | Chang et al. ................. 257/350 |
| 2011/0097889 A1 | 4/2011 | Yuan et al. |
| 2011/0175152 A1 * | 7/2011 | Booth et al. .................. 257/306 |
| 2011/0186929 A1 * | 8/2011 | Heinrich et al. .............. 257/350 |
| 2011/0260251 A1 * | 10/2011 | Cheng et al. ................. 257/350 |
| 2012/0132992 A1 * | 5/2012 | Ding et al. .................... 257/350 |
| 2012/0261756 A1 * | 10/2012 | Kanike et al. ................ 257/350 |
| 2013/0249004 A1 * | 9/2013 | Doris et al. .................. 257/350 |
| 2013/0307076 A1 * | 11/2013 | Cheng et al. ................. 257/350 |
| 2013/0334604 A1 * | 12/2013 | Scheiper et al. ............. 257/350 |
| 2014/0131802 A1 * | 5/2014 | Cai et al. ...................... 257/350 |

* cited by examiner

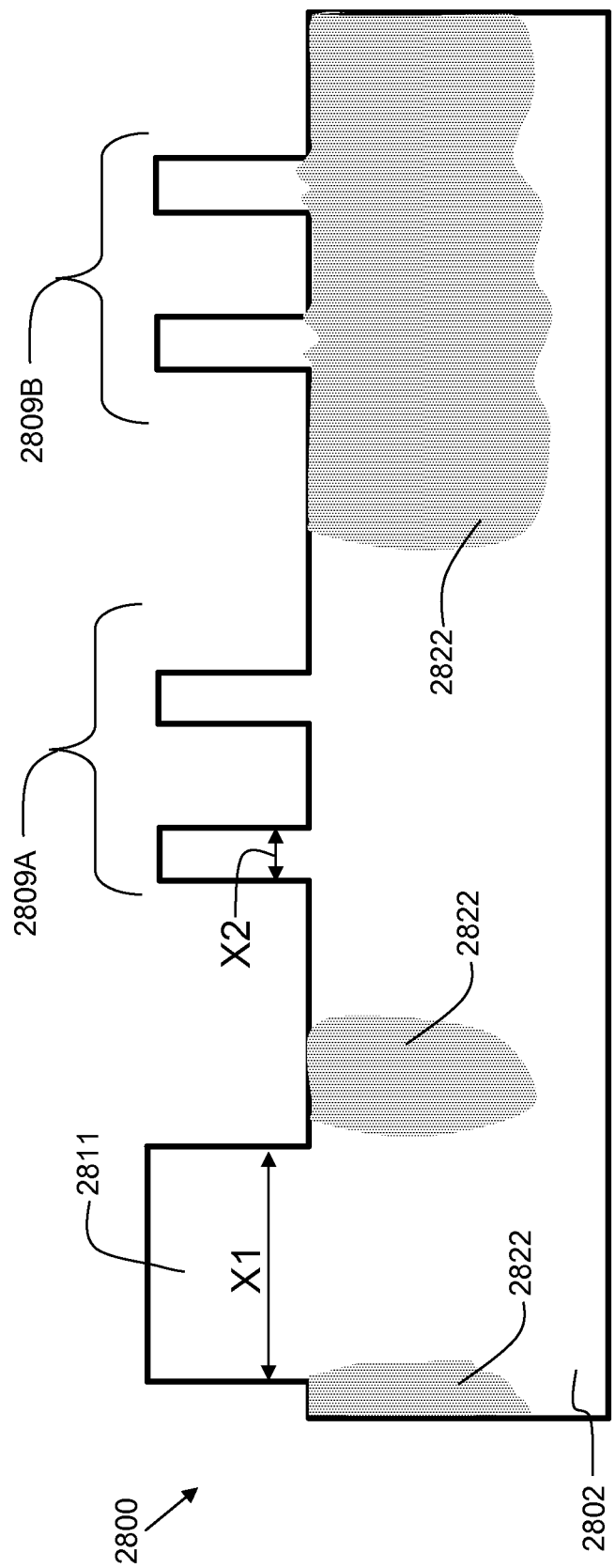

METHOD AND STRUCTURE FOR FORMING A LOCALIZED SOI FINFET

CROSS REFERENCE TO RELATED APPLICATIONS

This application is a continuation in part of copending U.S. application Ser. No. 13/670,768, entitled METHOD AND STRUCTURE FOR FORMING A LOCALIZED SOI FINFET, and filed on Nov. 7, 2012

FIELD OF THE INVENTION

The present invention relates generally to semiconductor fabrication, and more particularly to structures and methods for forming fin field effect transistors (FinFETs).

BACKGROUND OF THE INVENTION

With the continuing trend towards miniaturization of integrated circuits (ICs), there is a need for transistors to have higher drive currents with increasingly smaller dimensions. FinFET technology is becoming more prevalent as device size continues to shrink. Silicon-on-insulator (SOI) finFET devices have excellent electrical performance. However, the cost of manufacturing SOI finFETs can be high. Bulk finFETs, where there is no insulator film between the fins and the substrate, have a lower manufacturing cost as compared with a SOI finFET. However, bulk finFETs are prone to leakage currents which can degrade the electrical performance. It is therefore desirable to have improved methods and structures for implementation of finFET devices.

SUMMARY OF THE INVENTION

In one embodiment, a semiconductor structure is provided. The structure comprises a semiconductor substrate, a first fin disposed on the semiconductor substrate, an oxide region formed at the base of the first fin, and a shallow trench isolation region formed adjacent to, and in physical contact with the first fin at the base, wherein the shallow trench isolation region is below the level of the top of the first fin.

In another embodiment, a semiconductor structure is provided. The structure comprises a semiconductor substrate, a first fin disposed on the semiconductor substrate, having a top and a base, a second fin disposed on the semiconductor substrate, having a top and a base, wherein the top of the first fin and the top of the second fin are horizontally coplanar, wherein a portion of the semiconductor substrate comprises an oxidized region, and wherein the oxide region extends into the base of each fin, and wherein the distance between the oxide region and the top of the first fin is less than the distance between the oxide region and the top of the second fin.

In another embodiment, a method of forming a semiconductor structure is provided. The method comprises forming a fin on a bulk semiconductor substrate, depositing fin sidewall spacers on the fin, depositing a shallow trench isolation region in direct physical contact with the fin sidewall spacers and the bulk semiconductor substrate, performing an oxidation process to oxidize the base of the fin and a portion of the bulk semiconductor substrate, and performing a shallow trench isolation region recess.

In another embodiment, a method of forming a semiconductor structure is provided. The method comprises forming a first fin and a second fin on a bulk semiconductor substrate, depositing a mask region on the second fin, performing a first substrate recess adjacent to the first fin, removing the mask region, depositing sidewall spacers on the first fin and the second fin, depositing a shallow trench isolation region over the bulk semiconductor substrate, such that the shallow trench isolation region is in direct physical contact with the sidewall spacers, performing an oxidation process to oxidize the base of the first fin, the base of the second fin, and a portion of the bulk semiconductor substrate, and performing a shallow trench isolation region recess.

In another embodiment, a semiconductor structure is provided. The structure comprises a semiconductor substrate, a first set of fins formed on the semiconductor substrate, a second set of fins formed on the semiconductor substrate, and an oxide region formed within the semiconductor substrate below the second set of fins.

In another embodiment, a semiconductor structure is provided. The structure comprises a semiconductor substrate, a first set of fins formed on the semiconductor substrate, a second set of fins formed on the semiconductor substrate, wherein the first set of fins and second set of fins have a fin width, an oxide region formed within the semiconductor substrate below the second set of fins, and a planar region disposed on the semiconductor substrate, wherein the planar region has a width ranging from 10 to 30 times larger than the fin width.

In another embodiment, a method of forming a semiconductor structure is provided. The method comprises forming a plurality of fins on a semiconductor substrate having a top surface, depositing a nitride layer over the plurality of fins, depositing a mask region on a first subset of fins of the plurality of fins, performing a recess of the semiconductor substrate adjacent to a second subset of fins of the plurality of fins, removing the mask region, depositing an oxide layer on the semiconductor structure, forming an oxide region disposed below the second subset of fins, and recessing the oxide region to the top surface of the semiconductor substrate.

BRIEF DESCRIPTION OF THE DRAWINGS

The structure, operation, and advantages of the present invention will become further apparent upon consideration of the following description taken in conjunction with the accompanying figures (FIGS.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
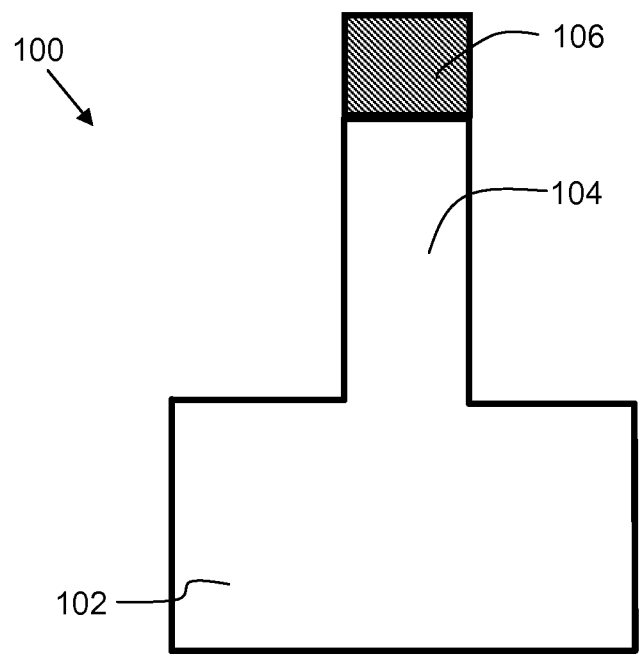

Often, similar elements may be referred to by similar numbers in various figures (FIGS.) of the drawing, in which case typically the last two significant digits may be the same, the most significant digit being the number of the drawing figure (FIG). Furthermore, for clarity, some reference numbers may be omitted in certain drawings.

FIG. 1 shows a semiconductor structure at a starting point for an embodiment of the present invention.

Figure 2:
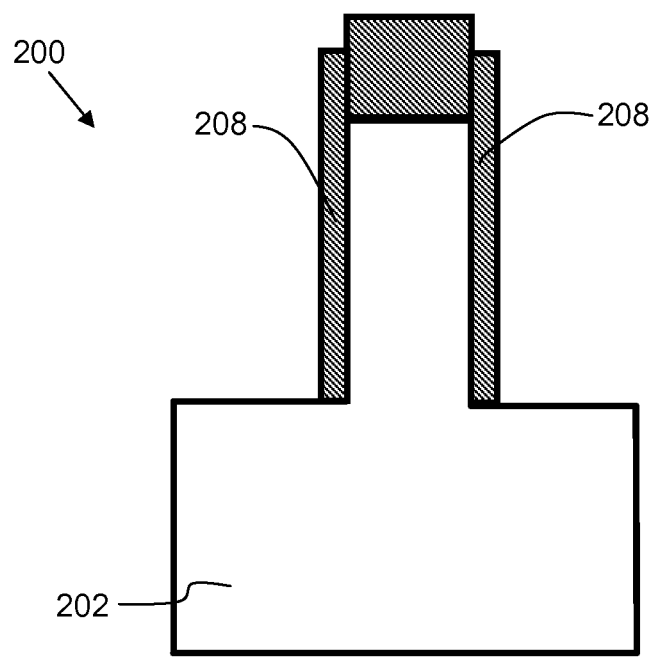

FIG. 2 shows a semiconductor structure after a subsequent processing step of depositing sidewall spacers.

Figure 3:
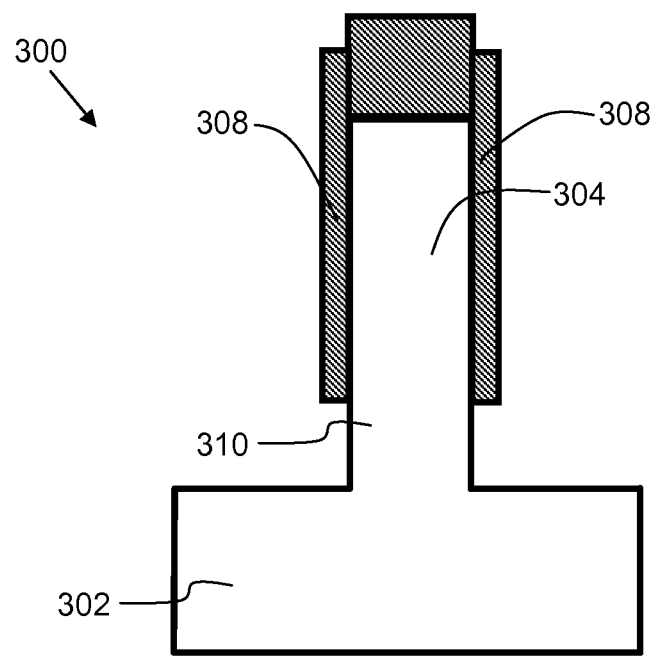

FIG. 3 shows a semiconductor structure after an optional subsequent processing step of performing a substrate recess.

Figure 4:
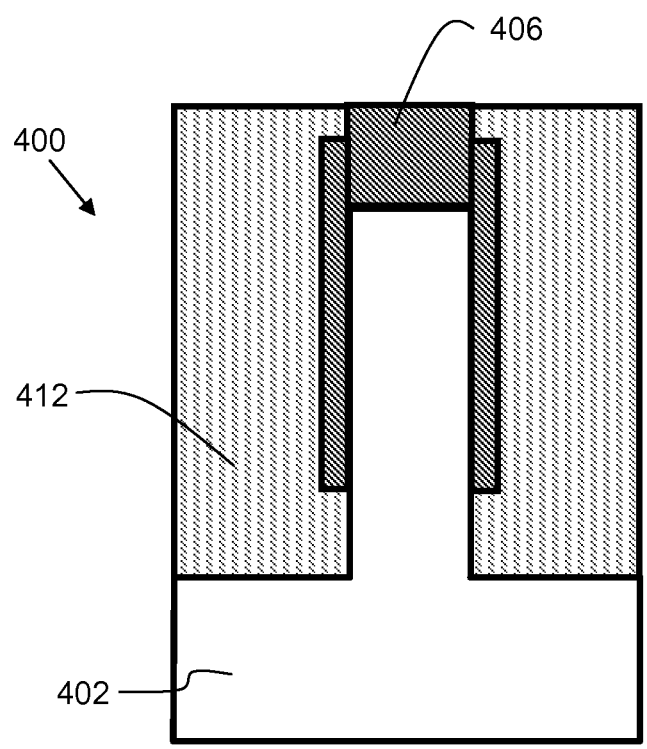

FIG. 4 shows a semiconductor structure after a subsequent processing step of depositing a shallow trench isolation region.

Figure 5:
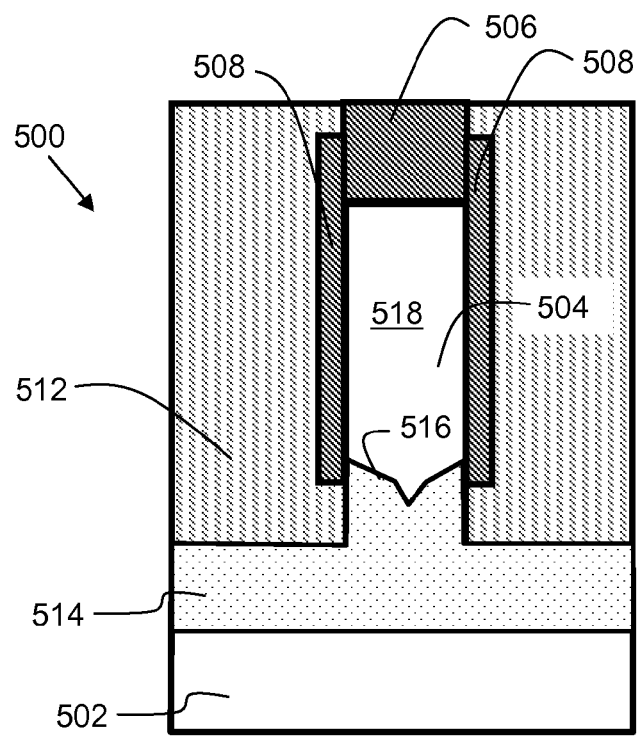

FIG. 5 shows a semiconductor structure after a subsequent processing step of performing an oxidation.

Figure 6:
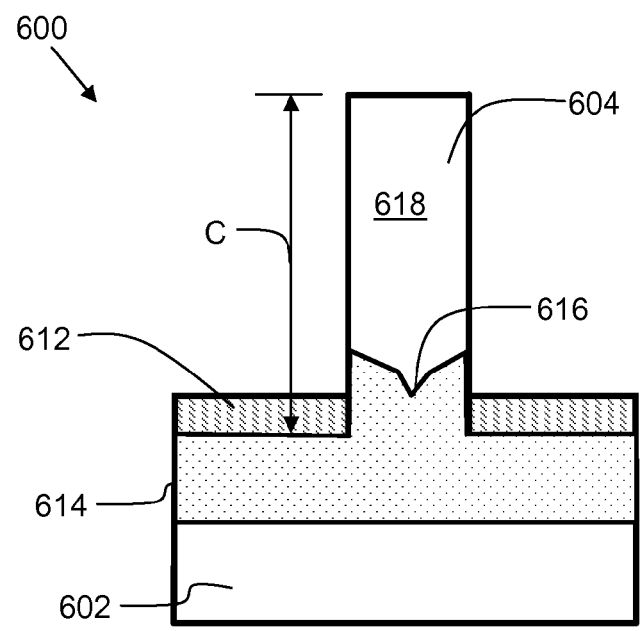

FIG. 6 shows a semiconductor structure after a subsequent processing step of removing spacers and the pad nitride layer.

Figure 7:
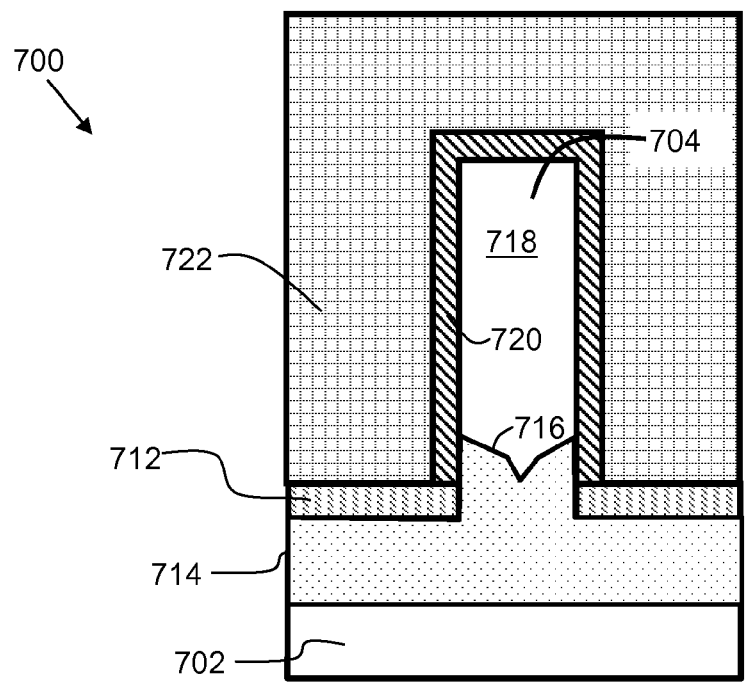

FIG. 7 shows a semiconductor structure in accordance with an embodiment of the present invention after the deposition of the gate dielectric and gate.

Figure 8:
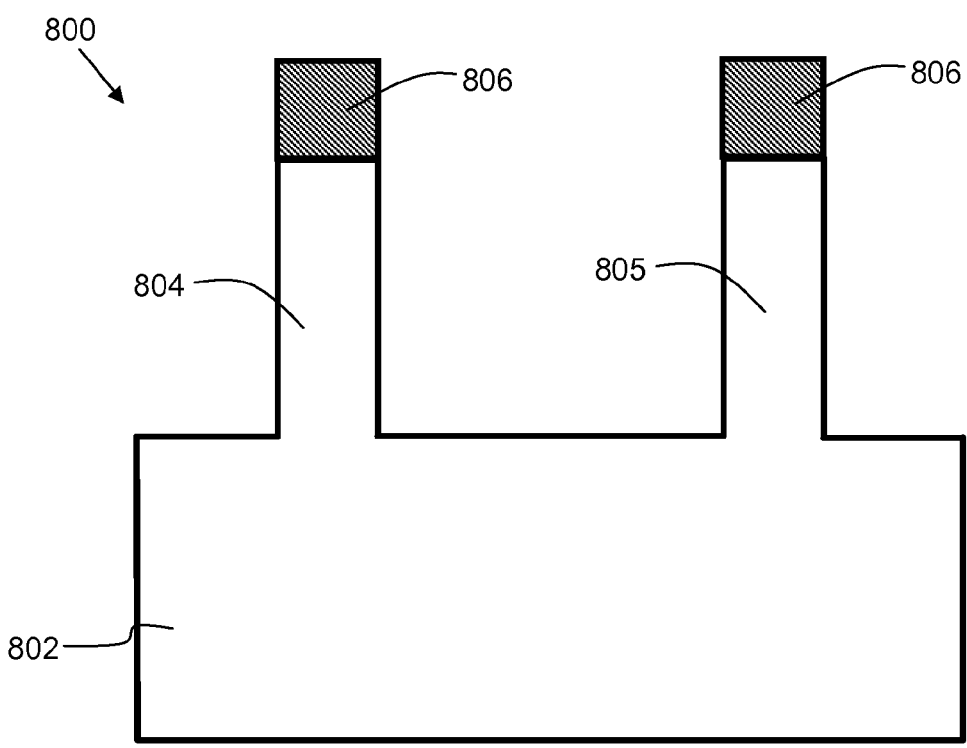

FIG. 8 is a semiconductor structure at a starting point for an additional embodiment of the present invention.

Figure 9:
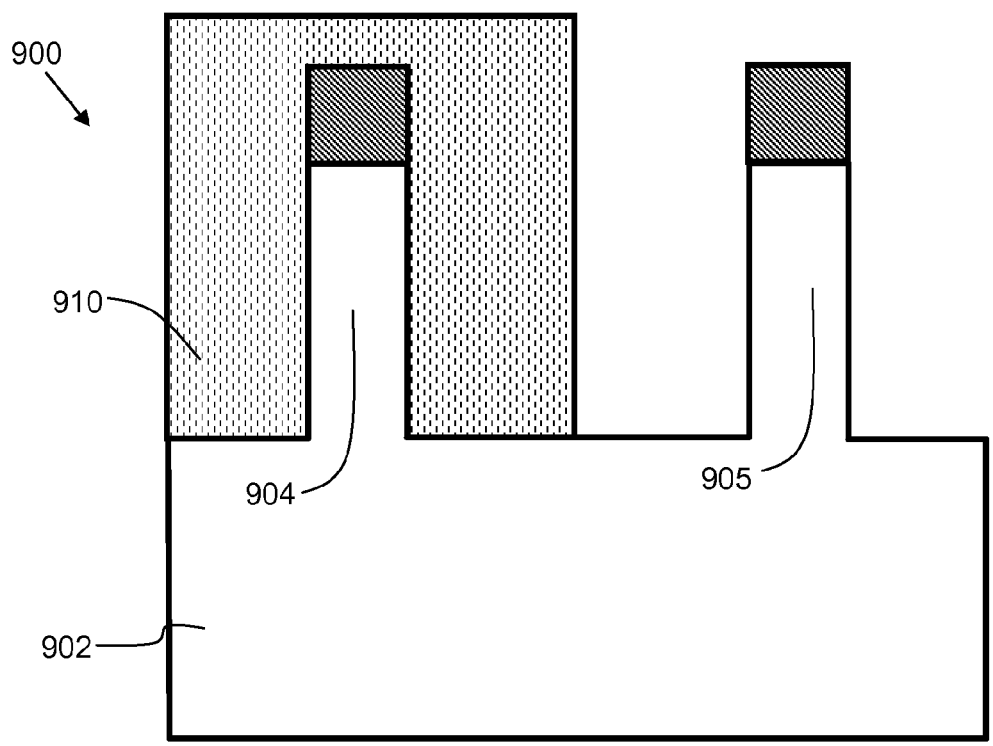

FIG. 9 is a semiconductor structure of the embodiment of FIG. 8 after a subsequent processing step of applying a mask layer.

Figure 10:
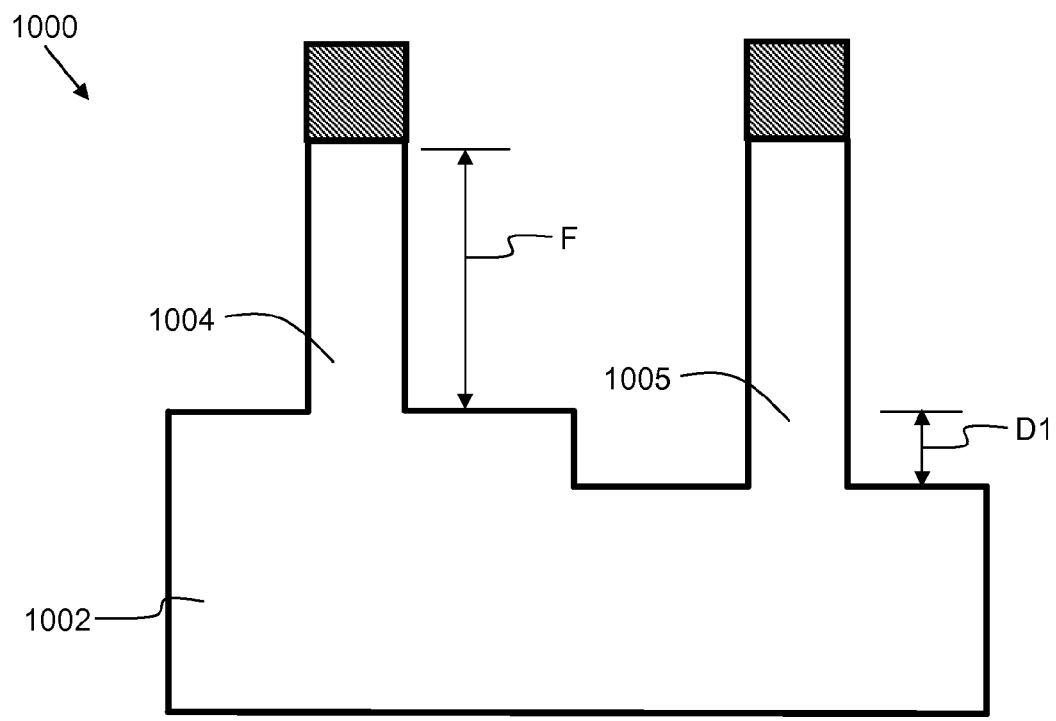

FIG. 10 is a semiconductor structure of the embodiment of FIG. 8 after subsequent processing steps of performing a substrate recess.

Figure 11:
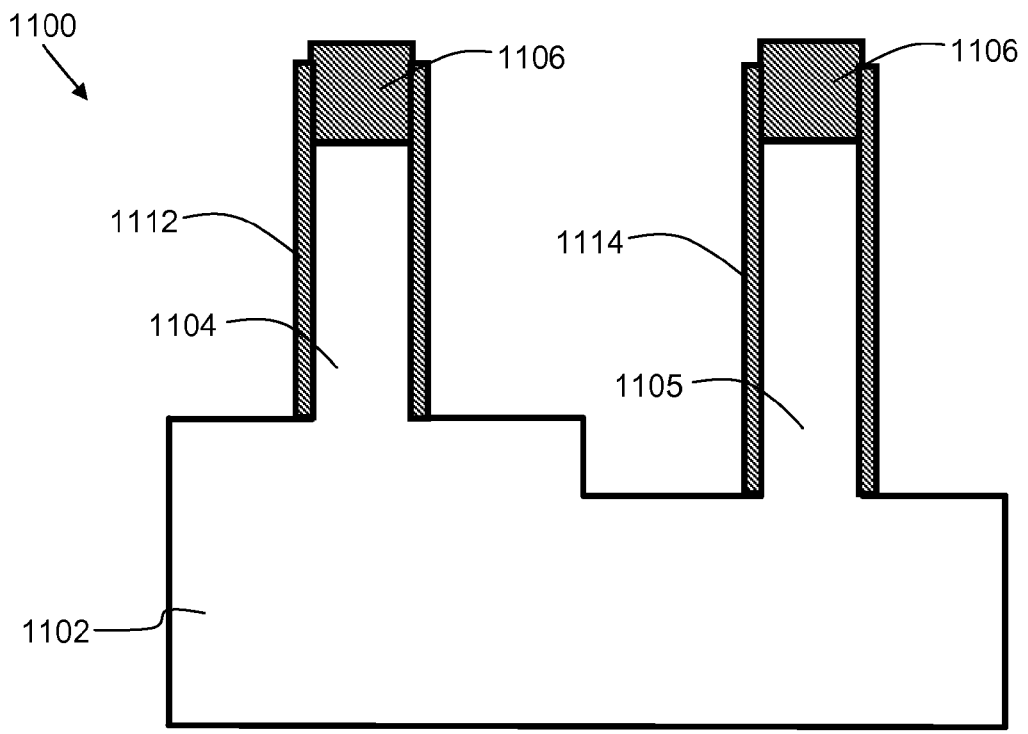

FIG. 11 is a semiconductor structure of the embodiment of FIG. 8 after a subsequent processing step of depositing fin sidewall spacers.

Figure 12:
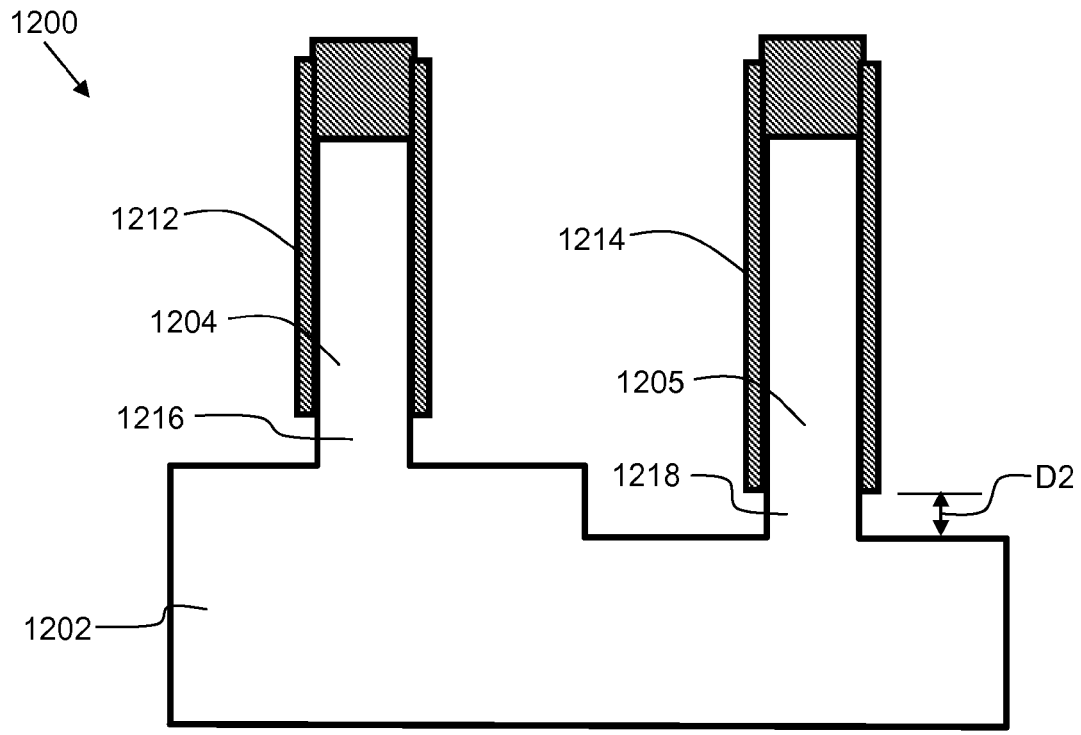

FIG. 12 is a semiconductor structure of the embodiment of FIG. 8 after a subsequent optional processing step of performing an additional substrate recess.

Figure 13:
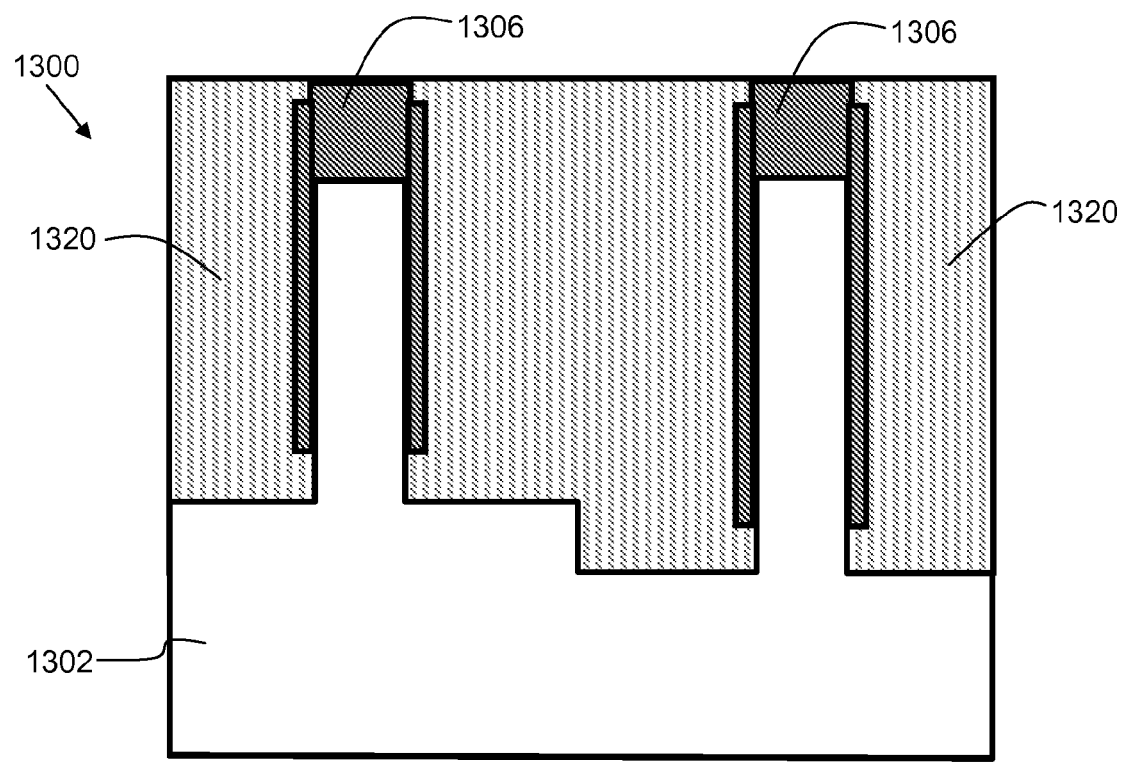

FIG. 13 is a semiconductor structure of the embodiment of FIG. 8 after a subsequent processing step of depositing a shallow trench isolation region.

Figure 14:
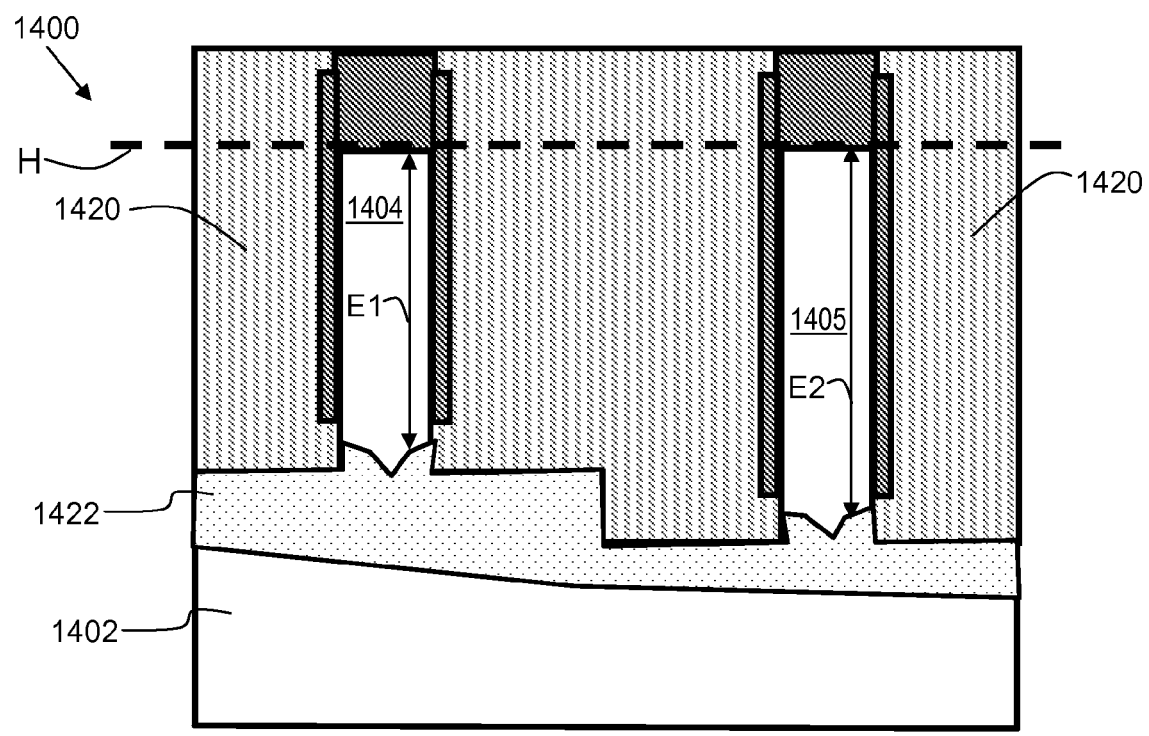

FIG. 14 is a semiconductor structure of the embodiment of FIG. 8 after a subsequent processing step of performing an oxidation.

Figure 15:
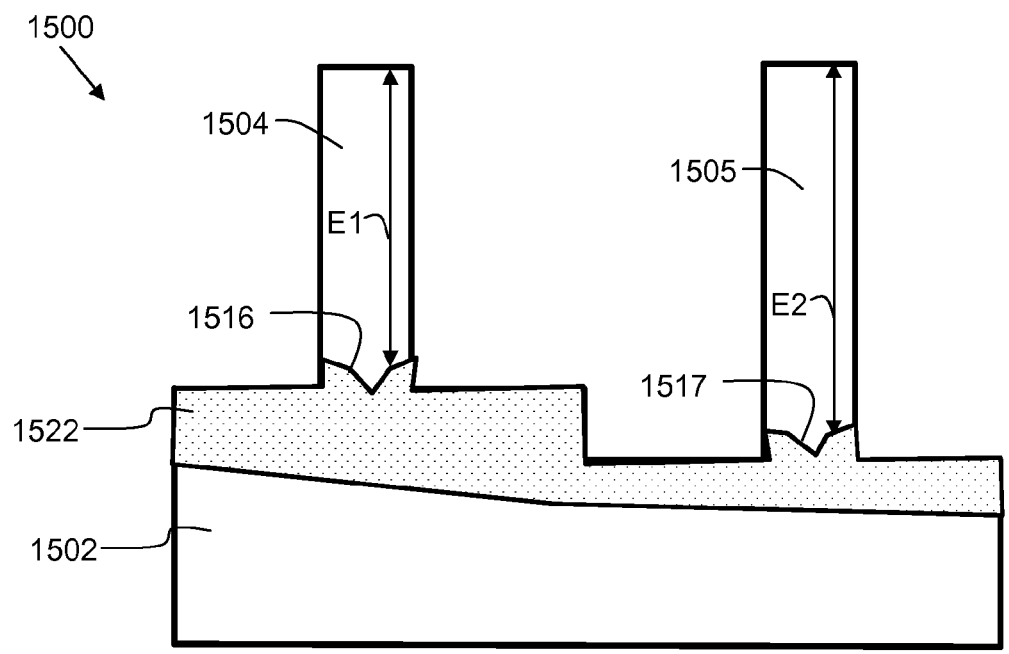

FIG. 15 is a semiconductor structure of the embodiment of FIG. 8 after subsequent processing steps of removing spacers and the pad nitride layer.

Figure 16:
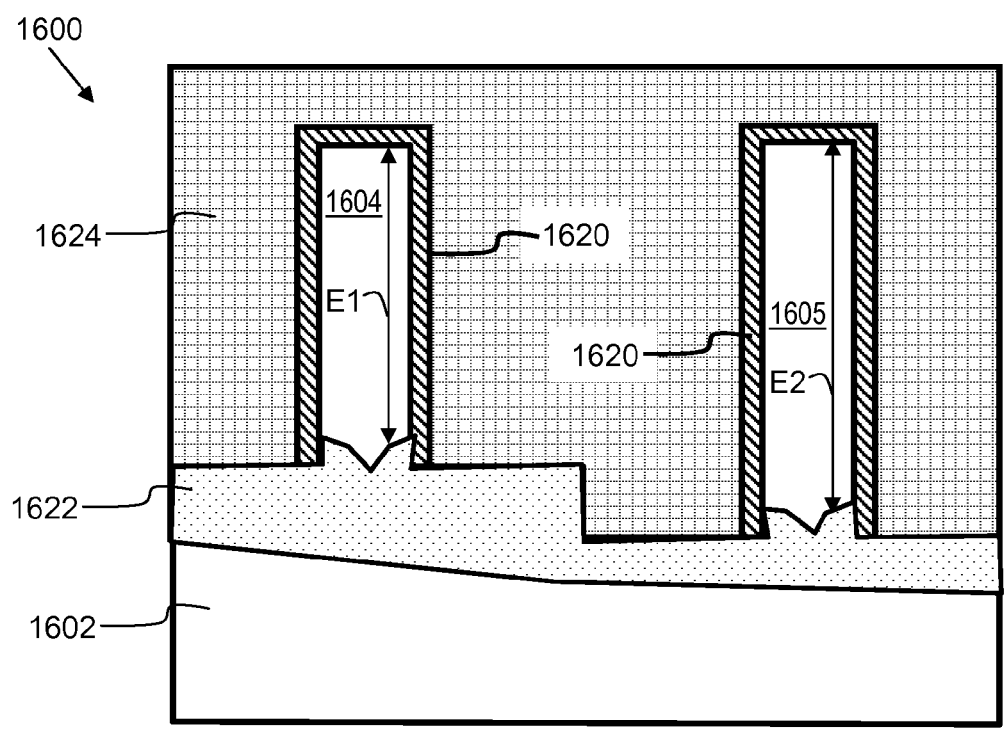

FIG. 16 is a semiconductor structure in accordance with an embodiment of the present invention after the deposition of the gate dielectric and gate.

Figure 17:
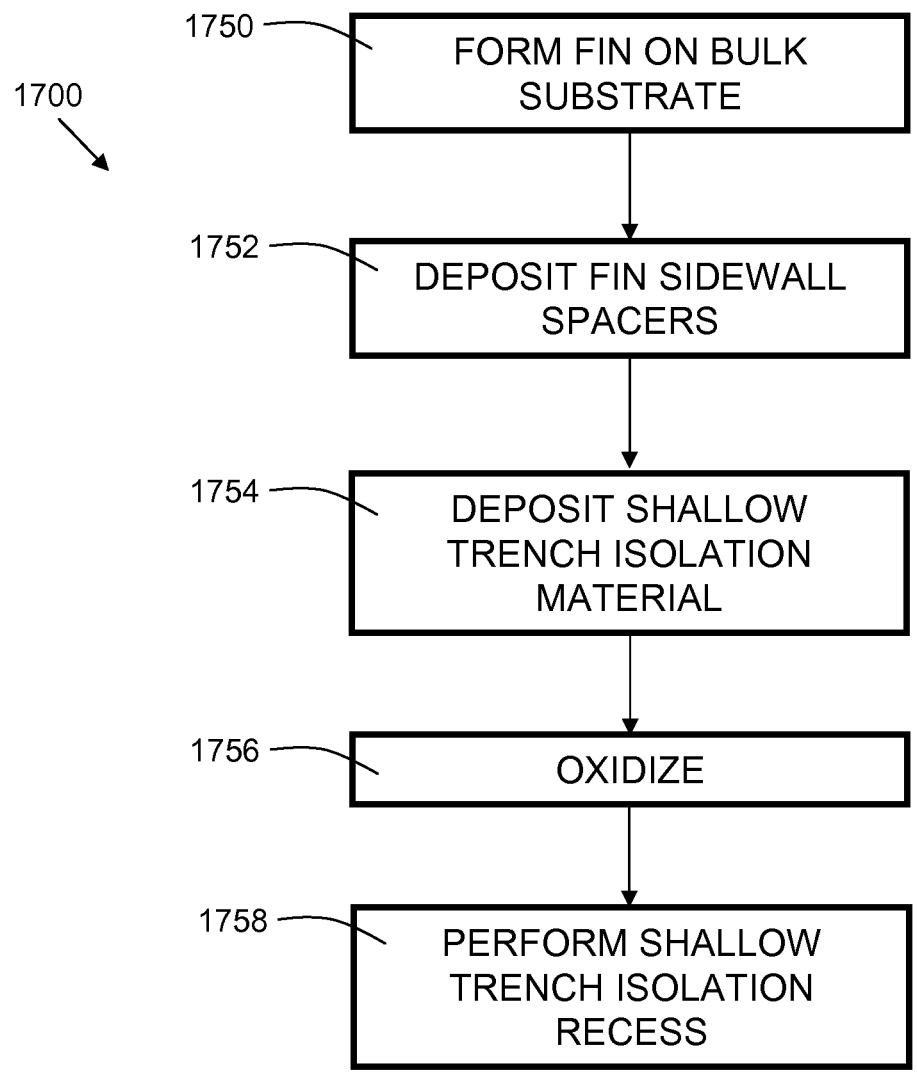

FIG. 17 is a flowchart indicating process steps for embodiments of the present invention.

Figure 18:
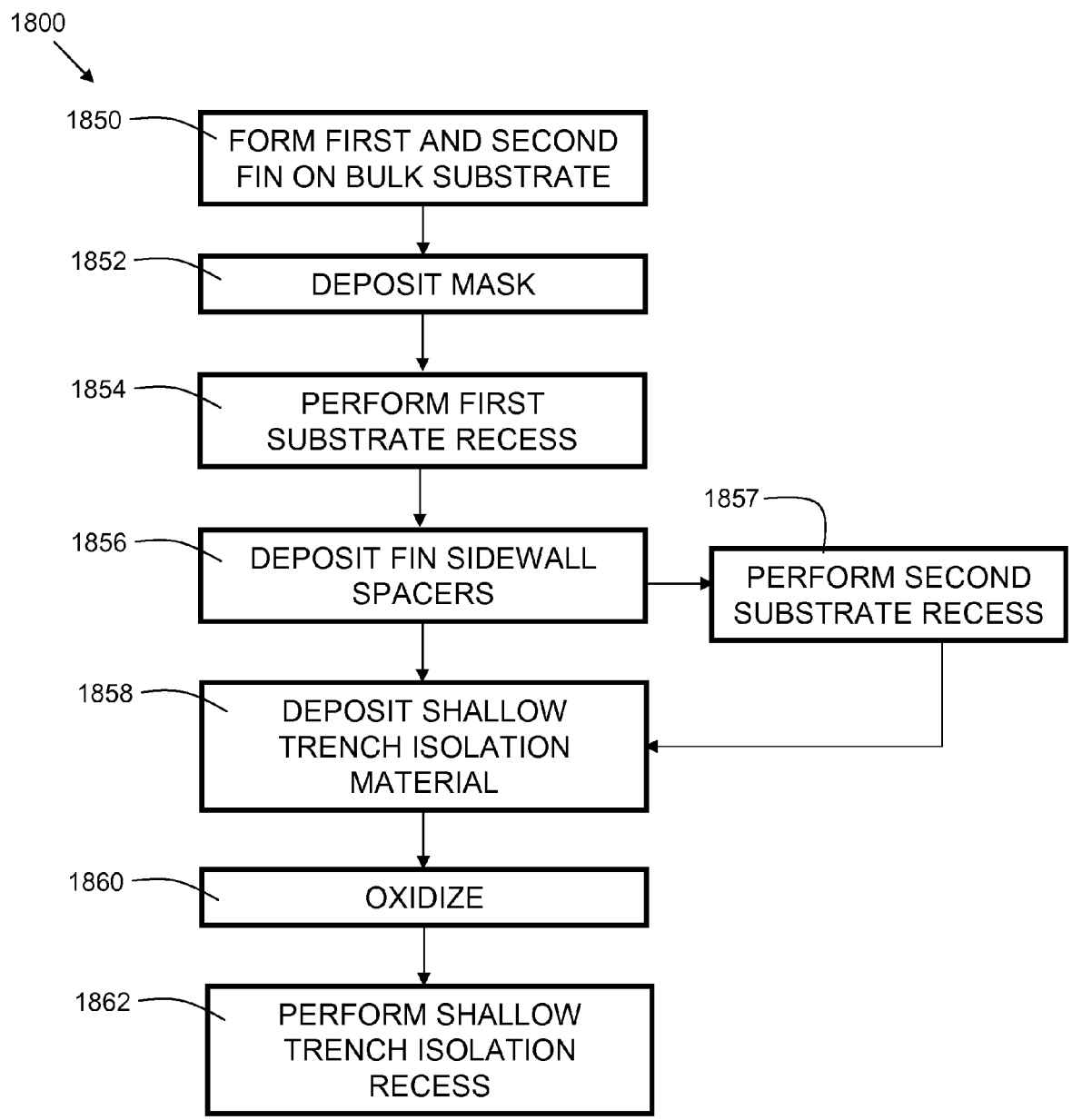

FIG. 18 is a flowchart indicating process steps for additional embodiments of the present invention.

Figure 19:
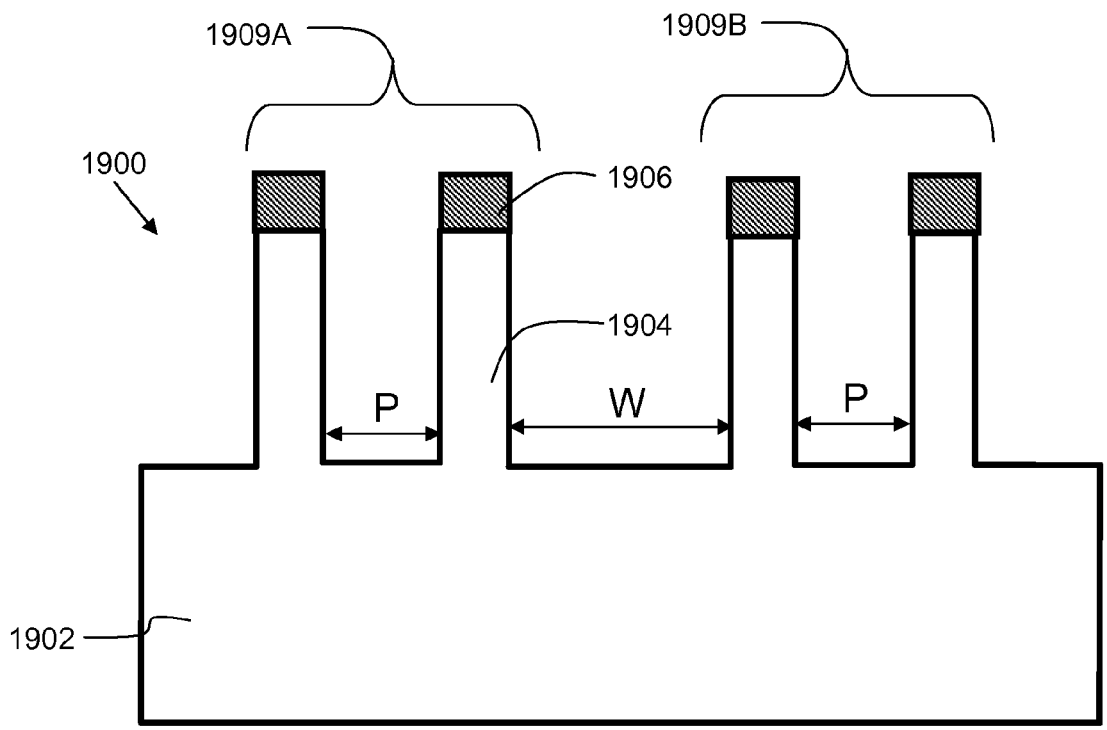

FIG. 19 is a semiconductor structure at a starting point for additional embodiments of the present invention.

Figure 20:
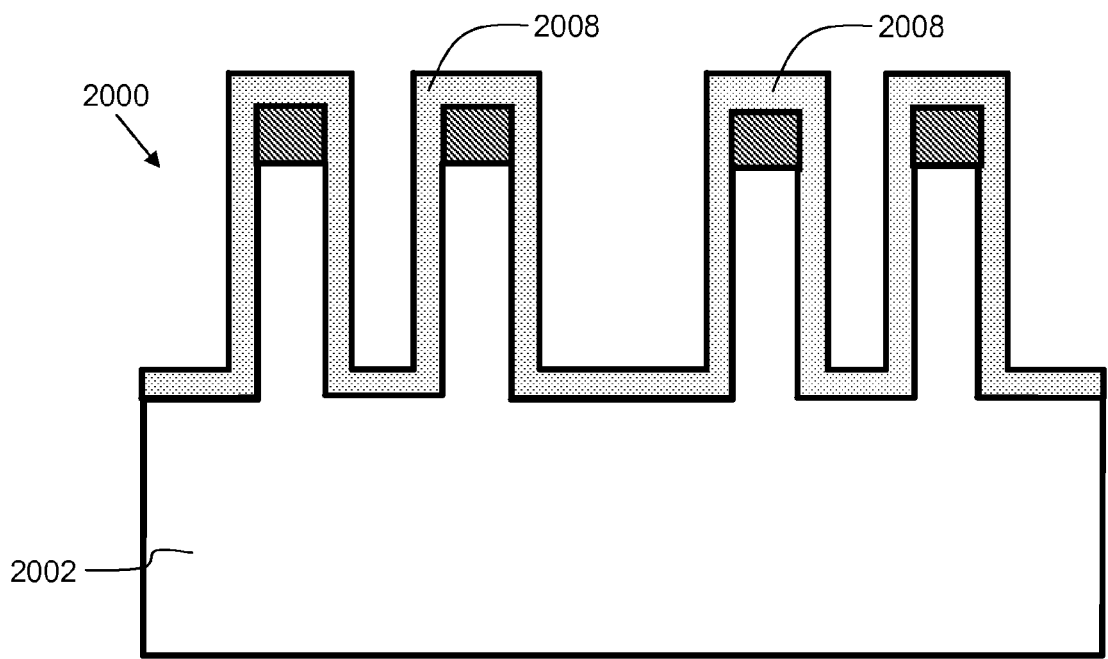

FIG. 20 is a semiconductor structure after a subsequent process step of depositing a nitride layer.

Figure 21:
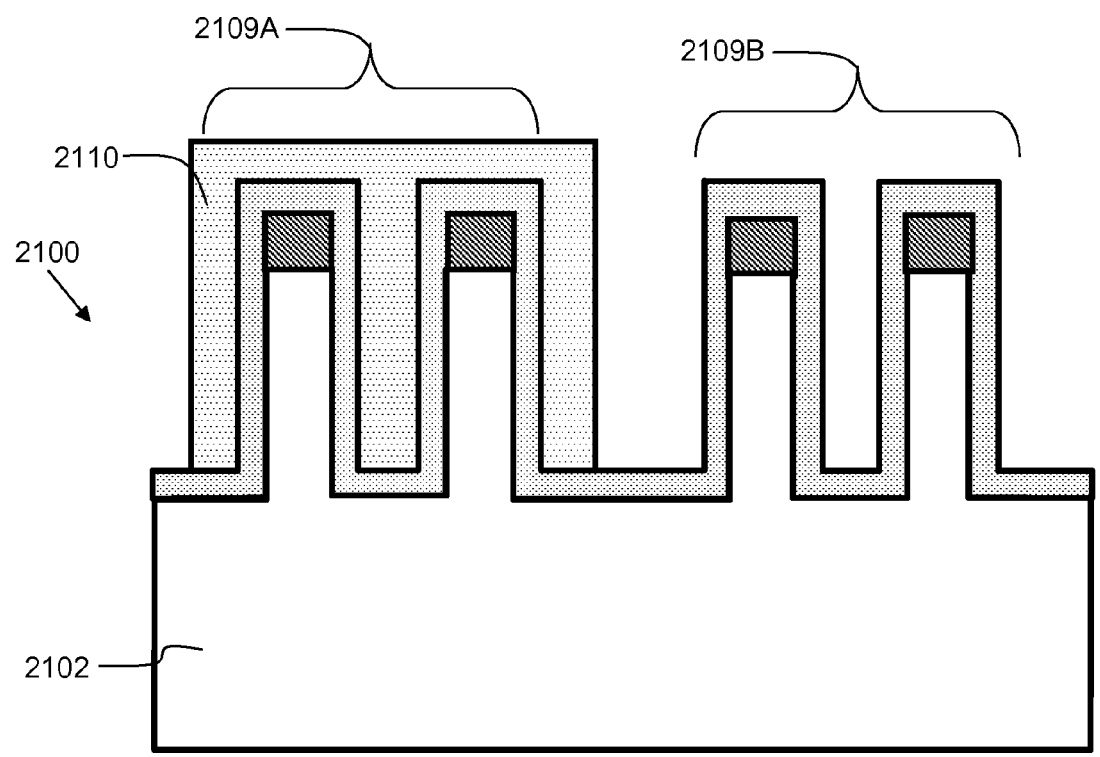

FIG. 21 is a semiconductor structure after a subsequent process step of depositing a mask over a first subset of fins.

Figure 22:
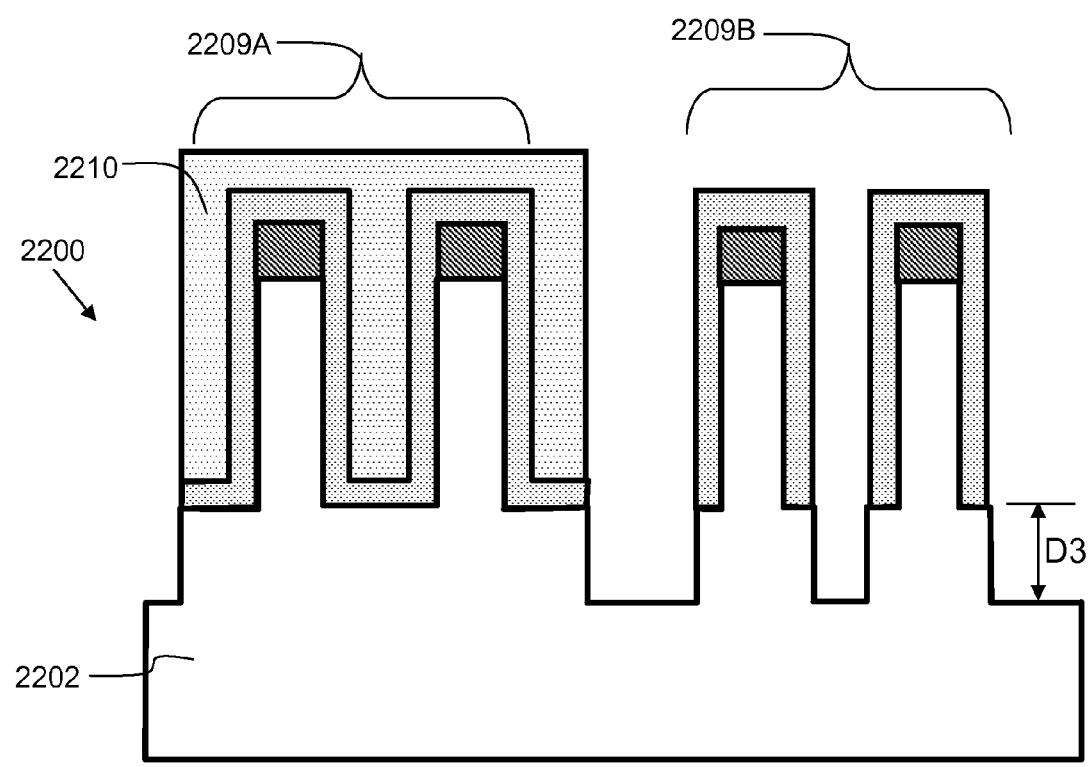

FIG. 22 is a semiconductor structure after a subsequent process step of recessing the structure adjacent to a second subset of fins.

Figure 23:
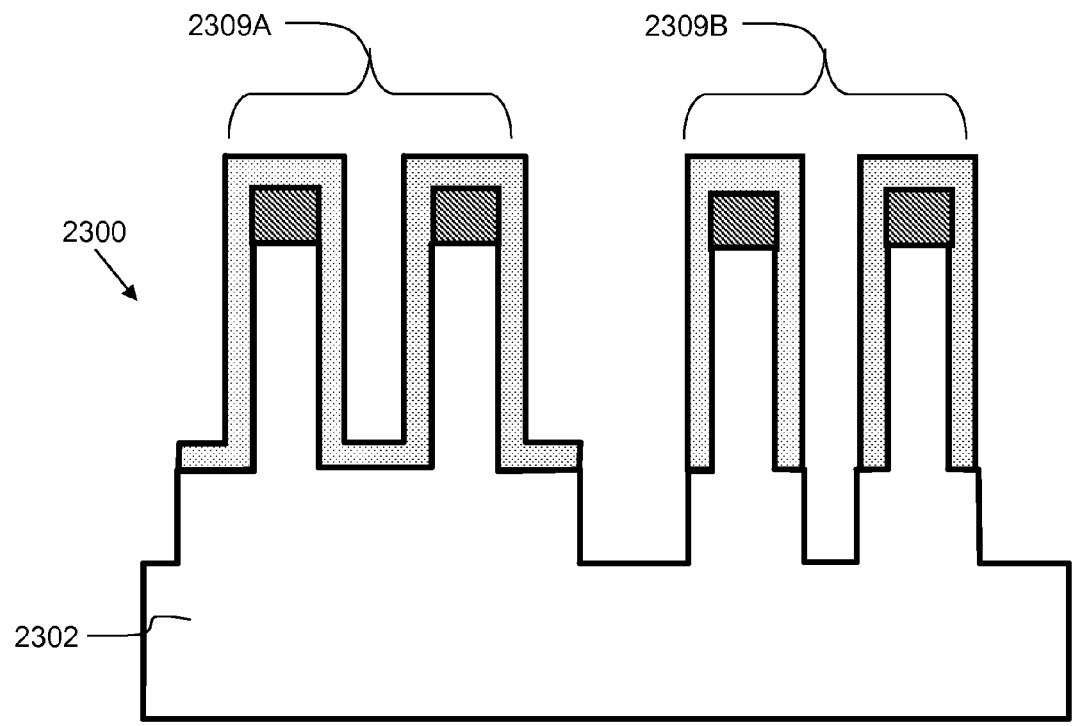

FIG. 23 is a semiconductor structure after a subsequent process step of removing the mask.

Figure 24:
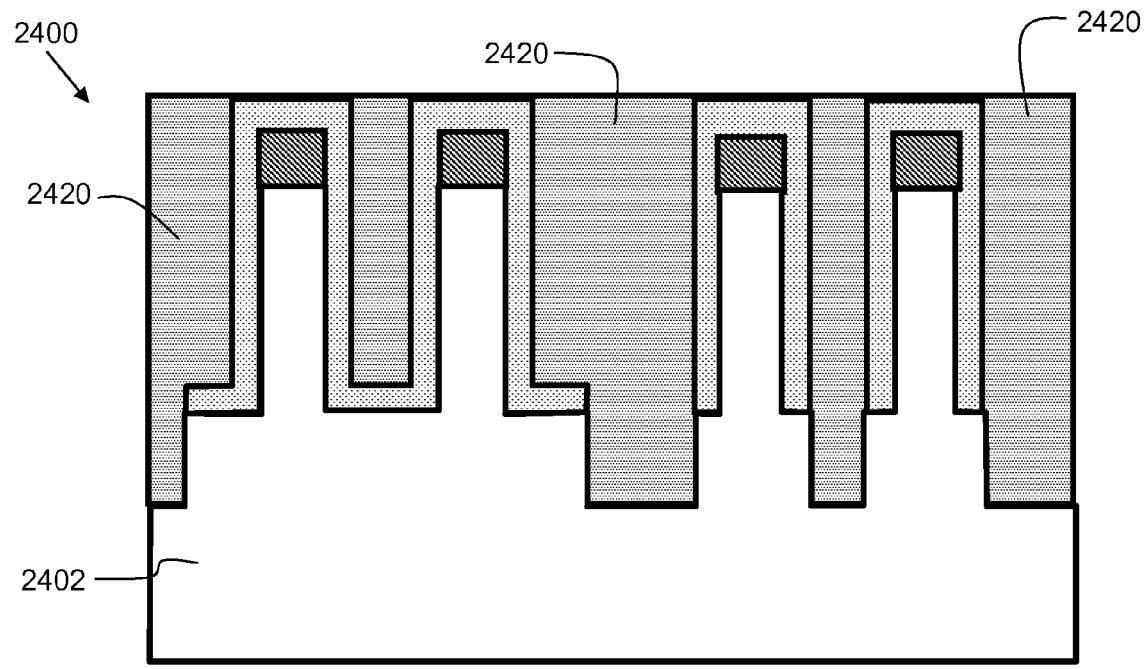

FIG. 24 is a semiconductor structure after a subsequent process step of depositing an oxide layer.

Figure 25:
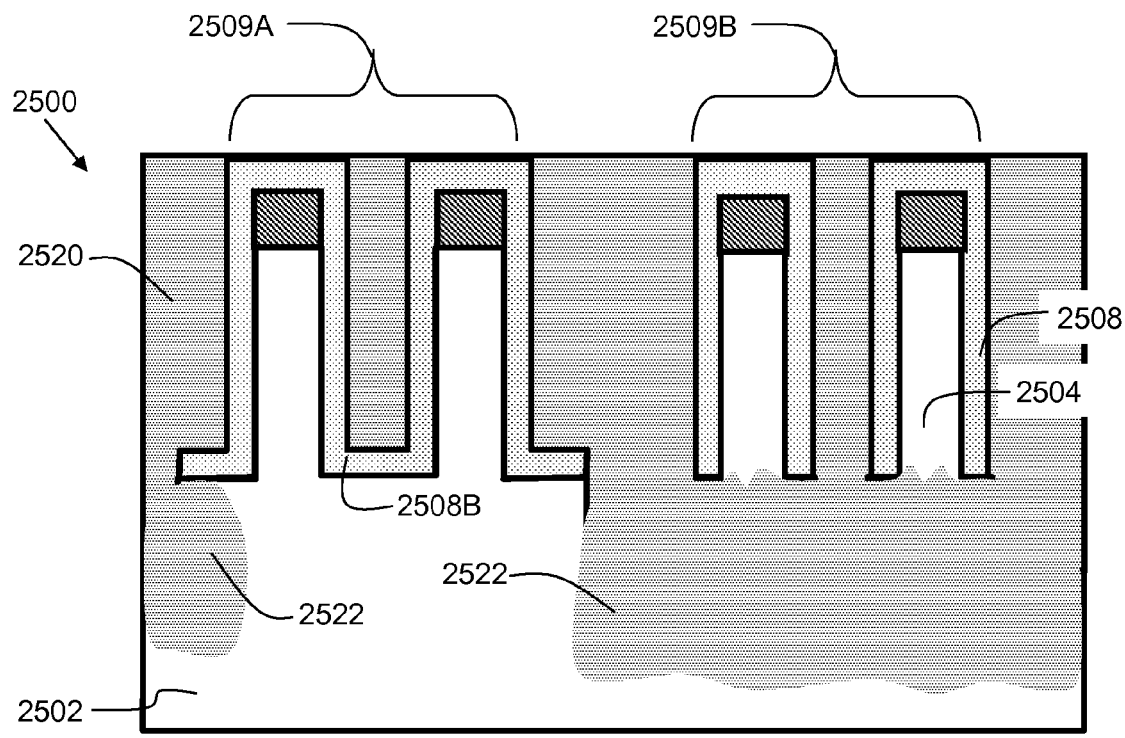

FIG. 25 is a semiconductor structure after a subsequent process step of performing an oxidation process.

Figure 26:
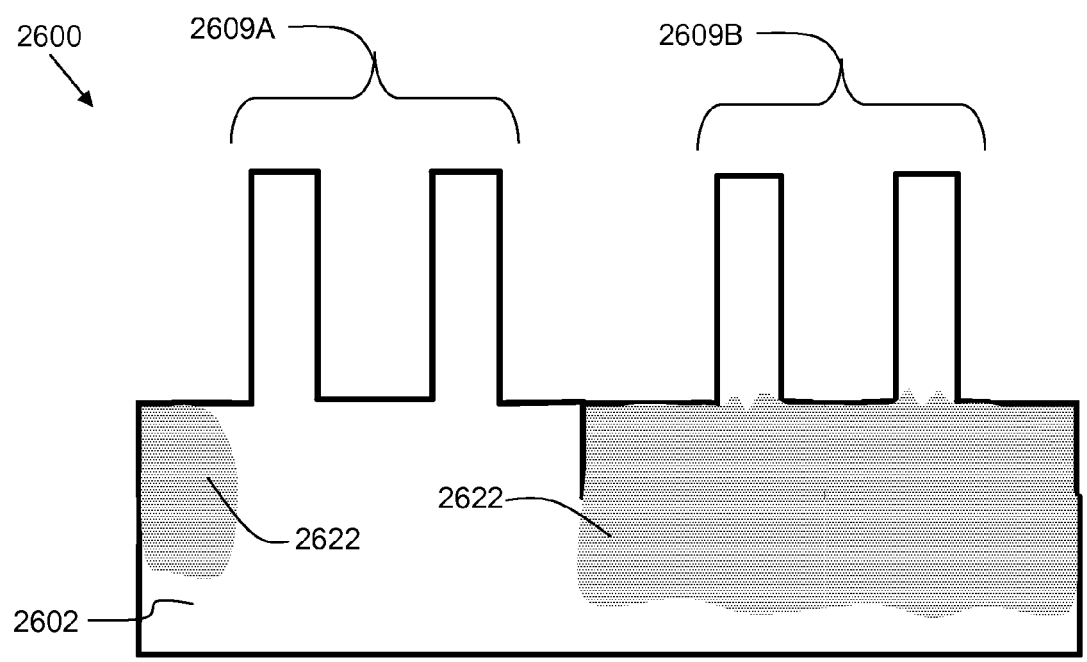

FIG. 26 is a semiconductor structure in accordance with an alternative embodiment of the present invention.

Figure 27:
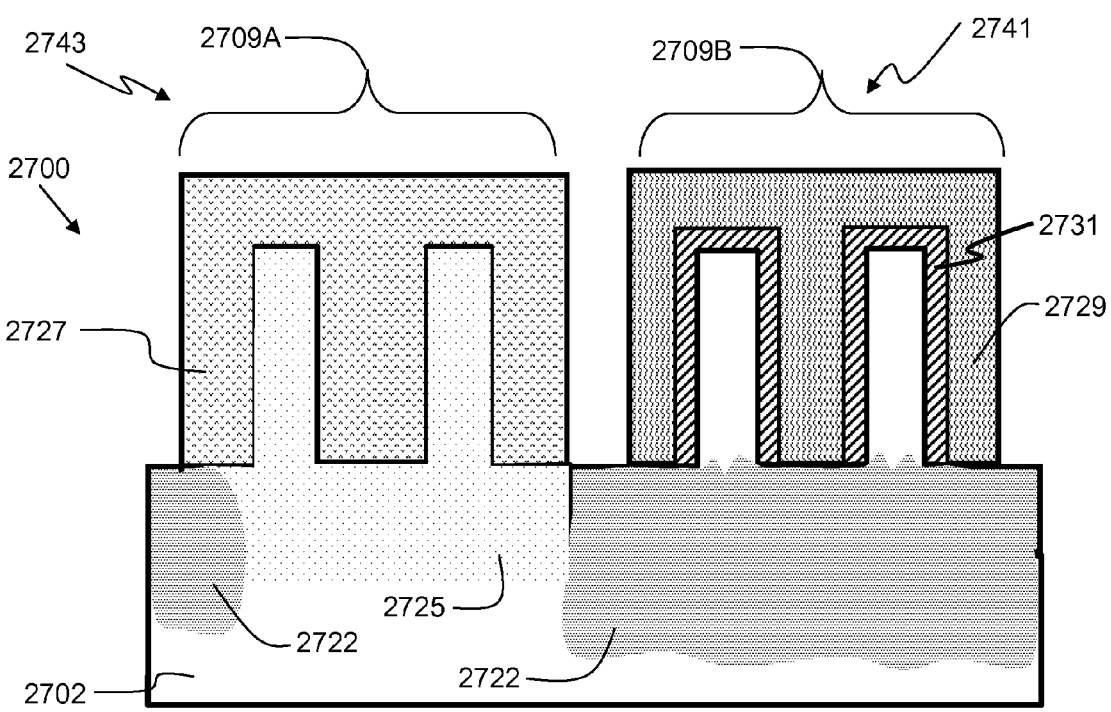

FIG. 27 is a semiconductor structure in accordance with an alternative embodiment of the present invention.

FIG. 28 is a semiconductor structure in accordance with an alternative embodiment of the present invention.

Figure 29A:
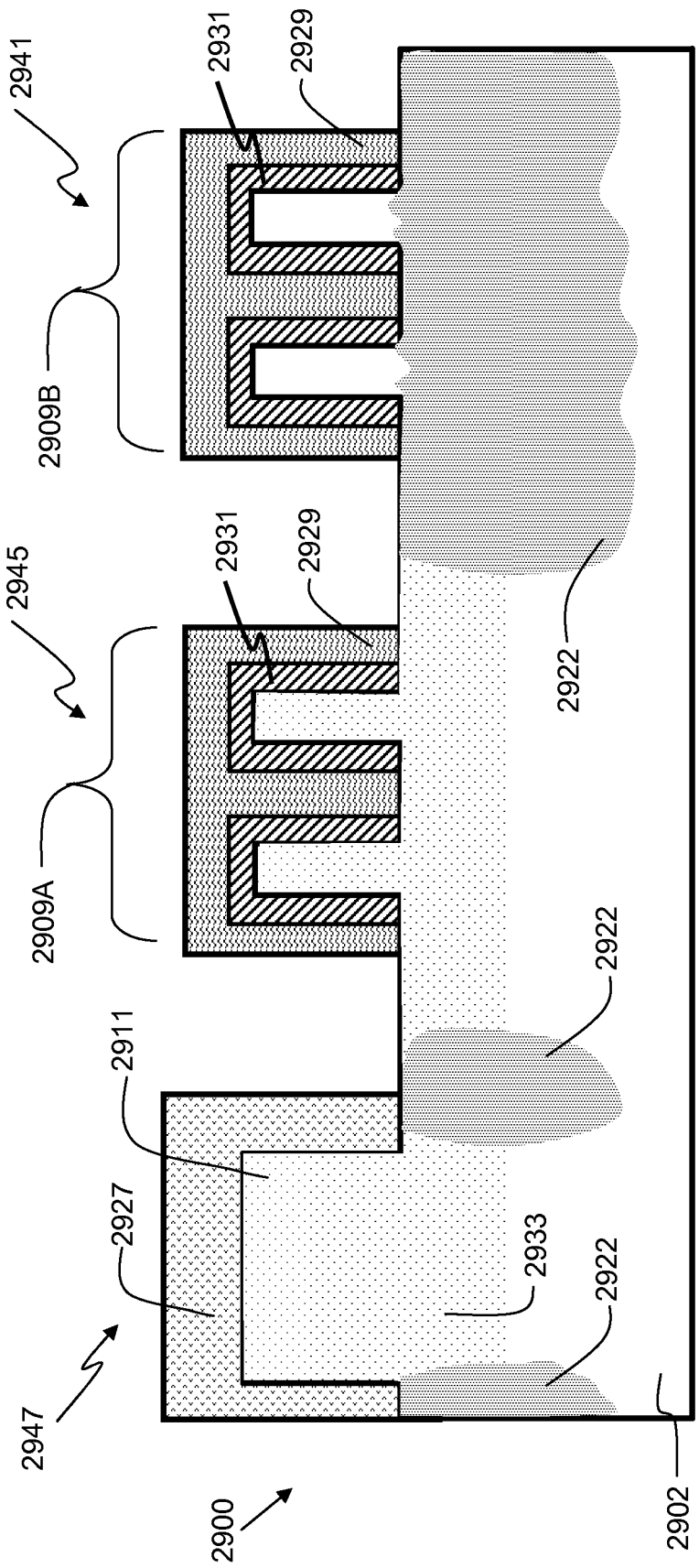

FIG. 29A is a semiconductor structure in accordance with an alternative embodiment of the present invention.

Figure 29B:
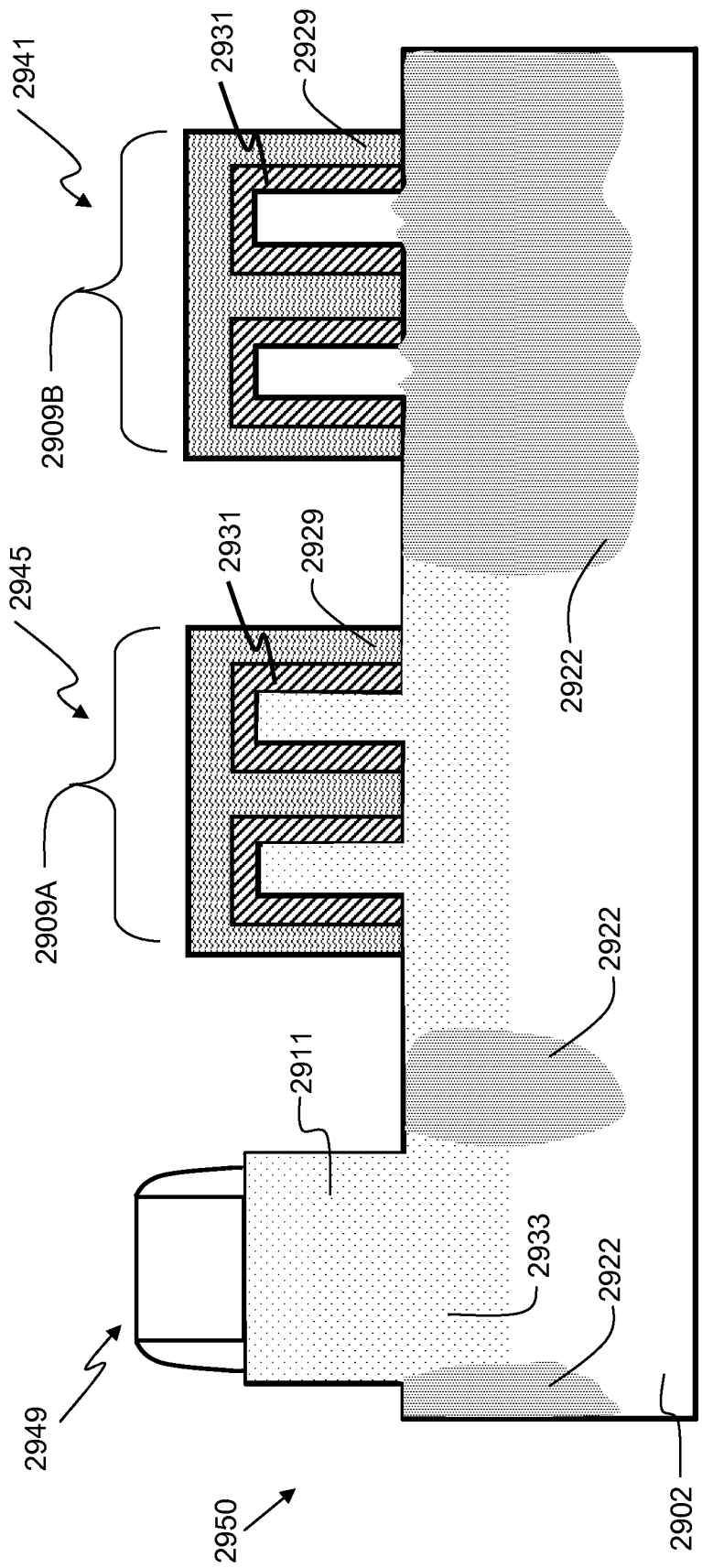

FIG. 29B is a semiconductor structure in accordance with an alternative embodiment of the present invention.

Figure 30:
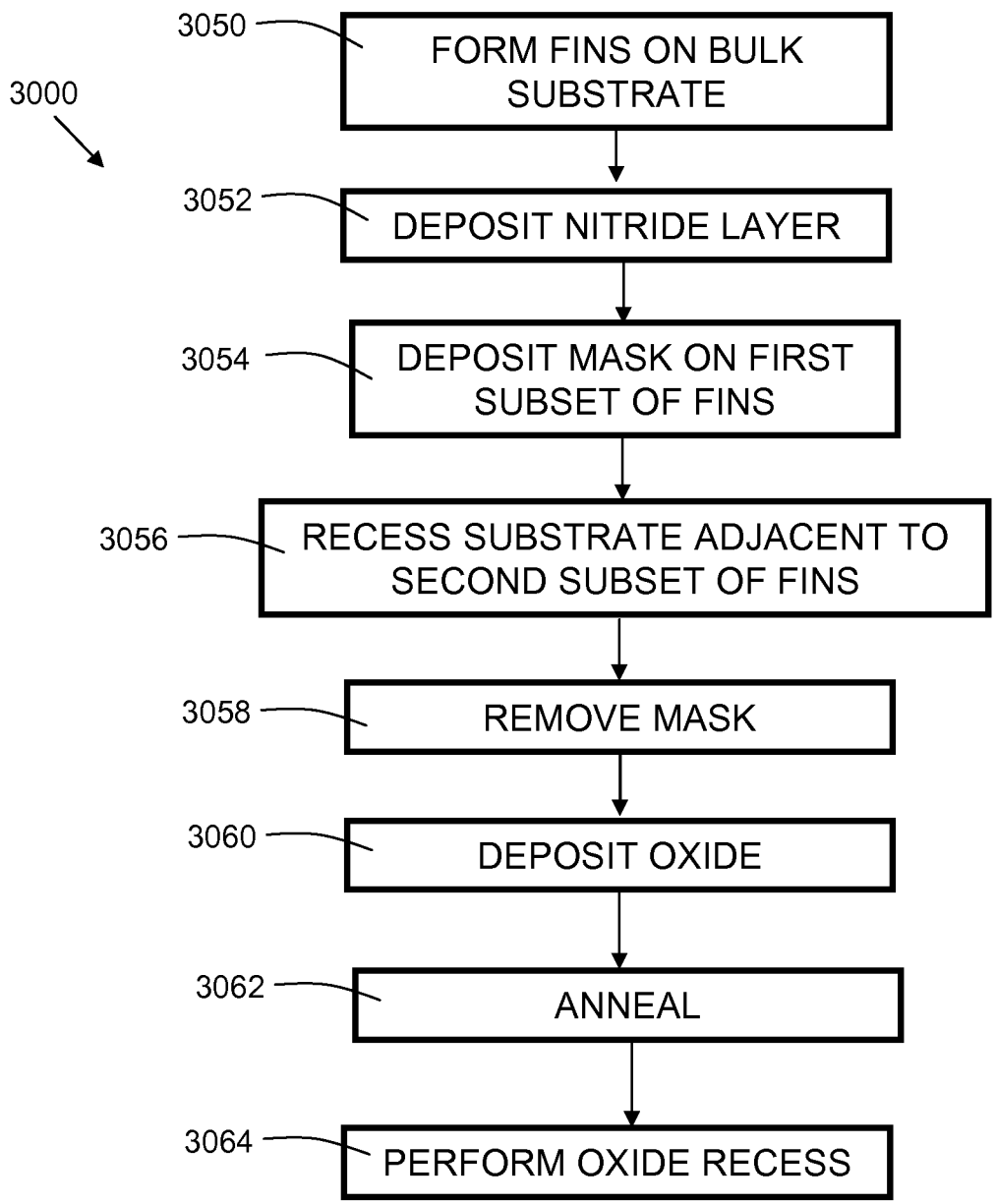

FIG. 30 is a flowchart indicating process steps for embodiments of the present invention.

DETAILED DESCRIPTION

FIG. 1 shows a semiconductor structure 100 at a starting point for an embodiment of the present invention. A bulk semiconductor substrate 102 forms the base of semiconductor structure 100. Bulk substrate 102 may be made from any of several known semiconductor materials such as, for example, silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials. Using industry-standard deposition and patterning techniques, a fin 104 is formed in the bulk substrate 102. A pad nitride layer 106 is disposed on top of fin 104. Note that for the sake of illustrative simplicity, only one fin 104 is shown. However, in practice, there may be multiple fins formed on substrate 102.

FIG. 2 shows a semiconductor structure 200 after a subsequent processing step of depositing fin sidewall spacers 208. As stated previously, similar elements may be referred to by similar numbers in various figures (FIGS.) of the drawing, in which case typically the last two significant digits may be the same. For example, bulk substrate 202 of FIG. 2 is similar to bulk substrate 102 of FIG. 1. The fin sidewall spacers 208 may be comprised of nitride.

FIG. 3 shows a semiconductor structure 300 after an optional subsequent processing step of performing a substrate recess. The substrate recess may be performed by any suitable technique, such as a reactive ion etch, chemical downstream etch, wet etch, or any other suitable etch technique. As a result of the substrate etch, the top surface of substrate 302 is lower than that of structure 200 of FIG. 2, exposing a lower portion of the fin 310 which is not covered by spacers 308.

FIG. 4 shows a semiconductor structure 400 after a subsequent processing step of depositing a shallow trench isolation region 412. The shallow trench isolation (STI) region 412 may be comprised of silicon oxide. Optionally, the shallow trench isolation region 412 may be planarized to the level of the pad nitride 406. The planarization may be performed via a chemical mechanical polish process.

FIG. 5 shows a semiconductor structure 500 after a subsequent processing step of performing an oxidation. The oxidation process may be a thermal oxidation process. In some embodiments, the oxidation occurs in a furnace set to a temperature in the range of 900 degrees Celsius to 1300 degrees Celsius. Oxygen in the furnace diffuses through the shallow trench isolation region to react with the silicon of the substrate 502, forming oxide region 514, which includes oxide region 516 formed at the base of the fin 504, leaving unoxided portion 518 of the fin. Oxide region 516 has a "V-shaped" or "tail" profile, in which the oxide region is higher near the exterior of the fin, and lower near the interior of the fin. During the oxidation process, mechanical stress can be imparted to the fin 504, due to volume expansion of the oxide as compared with silicon. Normally, this could cause the fin to mechanically shift or tilt, relative to the horizontal, such that the fin would no longer be perpendicular to the substrate 502. However, due to embodiments of the present invention, the shallow trench isolation region 512, being in direct physical contact with the fin 504 and fin sidewall spacers 508, the fin 504 is held firmly in place by the shallow trench isolation region 512 during the formation of oxide regions 514 and 516, and so the undesirable mechanical shift is prevented.

FIG. 6 shows a semiconductor structure 600 after a subsequent processing step of removing spacers and the pad nitride layer (compare with 506 and 508 of FIG. 5). The shallow trench isolation region is then recessed. A portion of the shallow trench isolation region 612 may remain after the recess. The fin 604 has a fin height C. In some embodiments, the fin height C ranges from about 20 nanometers to about 150 nanometers. In some embodiments, the shallow trench isolation region 612 has a height ranging from about 0.2 times the height of the fin to about 2 times the height of the fin. Optionally, the entire shallow trench isolation may be removed.

FIG. 7 shows a semiconductor structure 700 in accordance with an embodiment of the present invention after the deposition of the gate dielectric 720 and gate region 722. The semiconductor structure 700 comprises a semiconductor substrate 702. A fin 704 is disposed on the semiconductor substrate 702. An oxide region 716 is formed at the base of the fin 704, while unoxided fin portion 718 is above the oxide region 716. Oxide region 716 and 714 serve as a dielectric isolation for the fin 704. The gate dielectric 720 is disposed over the fin 704. In some embodiments, gate dielectric layer 720 may include but is not limited to: hafnium silicate (HfSiO), hafnium oxide (HfO2), zirconium silicate (ZrSiOx), zirconium oxide (ZrO2), silicon oxide (SiO2), silicon nitride (Si3N4), silicon oxynitride (SiON), or any other high-k material (k>4.0) or any combination of these materials. In some embodiments, the thickness of the gate dielectric 720 ranges from about 5 angstroms to about 30 angstroms.

A gate region 722 is disposed over the gate dielectric layer 720. In some embodiments, gate region 722 is comprised of polysilicon. In other embodiments, gate region 722 is a replacement metal gate (RMG), and may be comprised of a metal such as aluminum, titanium nitride (TiN) or ruthenium (Ru) for a pFET, or titanium aluminum (TiAl), aluminum nitride (AlN) or tantalum carbide (TaC) for an nFET. Semiconductor structure 700 can therefore implement a finFET which has the performance of a silicon-on-insulator (SOI) finFET, without the cost associated with a silicon-on-insulator (SOI) finFET fabricated with blanket oxide deposition FIG. 8 is a semiconductor structure 800 at a starting point for an additional embodiment of the present invention. A bulk semiconductor substrate 802 forms the base of semiconductor structure 800. Bulk substrate 802 may be made from any of several known semiconductor materials such as, for example, silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials. Using industry-standard deposition and patterning techniques, a fin 804 and another fin 805 are formed in the bulk substrate 802. A pad nitride layer 806 is disposed on top of fin 804 and fin 805. Note that for the sake of illustrative simplicity, only two fins 804 and 805 are shown. However, in practice, there may be multiple fins formed on substrate 802. In the description that follows, there is different processing for the two fins at certain phases of the fabrication process. Those skilled in the art will recognize that in practice, there may be multiple fins, where the fins are divided into different groups which may receive the different processing at certain phases of the fabrication process.

FIG. 9 is a semiconductor structure 900 of the embodiment of FIG. 8 after a subsequent processing step of applying a mask layer 910. The mask layer may be applied using industry-standard deposition and patterning techniques. The mask layer 910 is applied over fin 904, while fin 905 is exposed, and not covered by mask layer 910.

FIG. 10 is a semiconductor structure 1000 of the embodiment of FIG. 8 after subsequent processing steps of performing a substrate recess to a depth of D1, and then removing the mask (compare with 910 of FIG. 9). As a result of the substrate recess, the top surface of substrate 1002 is lower in the area adjacent to fin 1005, which was not covered by the mask layer (910 of FIG. 9). In some embodiments, depth D1 may be in the range of about 5 nanometers to about 40 nanometers. Hence, as a result of the substrate etch, fin 1004 has a fin length of F, which is the original fin length, and fin 1005 has a fin length of F+D1.

FIG. 11 is a semiconductor structure 1100 of the embodiment of FIG. 8 after a subsequent processing step of depositing fin sidewall spacers. Fin 1104 has fin spacers 1112, and fin 1105 has fin spacers 1114. Fin spacers 1114 are longer than fin spacers 1112 due to the recess of the substrate 1102 in the area near fin 1105.

FIG. 12 is a semiconductor structure 1200 of the embodiment of FIG. 8 after a subsequent optional processing step of performing an additional substrate recess to a depth D2. This recess applies to the entire structure 1200, hence both fin 1204 and fin 1205 are subject to this recess. In some embodiments, depth D2 may be in the range of about 5 nanometers to about 100 nanometers. As a result of this substrate recess, an unexposed base portion 1216 of fin 1204 is formed below the spacers 1212. Similarly, an unexposed base portion 1218 of fin 1205 is formed below the spacers 1214.

FIG. 13 is a semiconductor structure 1300 of the embodiment of FIG. 8 after a subsequent processing step of depositing a shallow trench isolation region 1320. The shallow trench isolation region 1320 may be comprised of silicon oxide. Optionally, the shallow trench isolation region 1320 may be planarized to the level of the pad nitride 1306. The planarization may be performed via a chemical mechanical polish process.

FIG. 14 is the semiconductor structure of the embodiment of FIG. 8 after a subsequent processing step of performing an oxidation. The oxidation process may be a thermal oxidation process. In some embodiments, the oxidation occurs in a furnace set to a temperature in the range of 900 degrees Celsius to 1300 degrees Celsius. Oxygen in the furnace diffuses through the shallow trench isolation region to react with the silicon of the substrate 1402, forming oxide region 1422 which provides electrical isolation for fin 1404 and fin 1405. Both fin 1404 and fin 1405 are horizontally coplanar at the fin tops, and have the same physical height, terminating at level H. The horizontal coplanarity simplifies downstream processing steps, such as planarization processes. However, fin 1404 and fin 1405 have different electrical heights, which provided improved design flexibility. The electrical height is the length of the unoxided portion of the fin. Hence, fin 1404 has an electrical fin height of E1, whereas fin 1405 has an electrical fin height of E2, where E1<E2, and the physical height of both fins are at level H. Maintaining both fins at the identical physical height improves planarity issues, and simplifies downstream processing steps, while the different electrical heights of each fin give a circuit designer flexibility for designing finFETs with different electrical characteristics on the same semiconductor structure.

FIG. 15 is a semiconductor structure 1500 of the embodiment of FIG. 8 after subsequent processing steps of removing spacers and the pad nitride layer (compare with 1106, 1112, and 1114 of FIG. 11). Oxide region 1516 and oxide region 1517, located in the base of their respective fins, have a "V-shaped" or "tail" profile, in which the oxide region is higher near the exterior of the fin, and lower near the interior of the fin.

FIG. 16 is a semiconductor structure 1600 in accordance with an embodiment of the present invention after the deposition of the gate dielectric 1620 and gate region 1624. Semiconductor structure 1600 comprises fin 1604 and fin 1605. Fin 1604 and fin 1605 are coplanar at the fin tops. Oxide region 1622 provides dielectric isolation for fin 1604 and fin

1605. Fin 1604 has an electrical height E1 and fin 1605 has an electrical height E2. The electrical height is the length of the unoxided portion of each fin. Hence, fin 1604 has a shorter electrical height E1 than electrical fin height E2 of fin 1605. In embodiments, fin 1604 has an electrical fin height E1 ranging from about 70 nanometers to 150 nanometers, and fin 1605 has an electrical fin height E2 ranging from about 40 nanometers to about 120 nanometers.

FIG. 17 is a flowchart 1700 indicating process steps for embodiments of the present invention. In process step 1750, a fin is formed on a bulk substrate (see 104 of FIG. 1). In process step 1752, fin spacers are deposited on the fin sidewalls (see 208 of FIG. 2). In process step 1754, shallow trench isolation (STI) material is deposited on the structure (see 412 of FIG. 4). In process step 1756, an oxidation process is performed, resulting in oxidation regions (see 514 of FIG. 5). In process step 1758, the shallow trench isolation material is recessed (see 612 of FIG. 6).

FIG. 18 is a flowchart 1800 indicating process steps for additional embodiments of the present invention. In process step 1850, a first fin and second fin are formed on a bulk substrate (see 804 and 805 of FIG. 8). In process step 1852, a mask is deposited over one fin (see 910 of FIG. 9). Note that in practical embodiments, the mask is deposited over multiple fins comprising a group of fins. In process step 1854, a first substrate recess is performed (see D1 of FIG. 10). In process step 1856, fin sidewall spacers are deposited (see 1112 and 1114 of FIG. 11). In process step 1857, optionally, a second substrate recess is performed (see D2 of FIG. 12). The second recess serves to expose a portion of the fin at the base so it can be oxidized in an upcoming process step. In process step 1858, shallow trench isolation material is deposited (see 1320 of FIG. 13). In process step 1860, an oxidation process is performed, resulting in oxidation regions (see 1422 of FIG. 14). In process step 1862, the shallow trench isolation material is recessed (see 1500 of FIG. 15).

Embodiments of the present invention provide for methods and structures for forming a localized silicon-on-insulator (SOI) finFET. Fins are formed on a bulk substrate. Nitride spacers protect the fin sidewalls. A shallow trench isolation region is deposited over the fins. An oxidation process causes oxygen to diffuse through the shallow trench isolation region and into the underlying silicon. The oxygen reacts with the silicon to form oxide, which provides electrical isolation for the fins. The shallow trench isolation region is in direct physical contact with the fins and/or the nitride spacers that are disposed on the fins. This stabilizes the fins and prevents fin tilt due to oxidation-induced stress that occurs as a result of the oxidation process.

FIG. 19 is a semiconductor structure 1900 at a starting point for another embodiment of the present invention. Substrate 1902 may be made from any of several known semiconductor materials such as, for example, silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials. Using industry-standard deposition and patterning techniques, fins, shown generally as 1904 are formed in the bulk substrate 1902. A pad nitride layer 1906 is disposed on top of fins 1904. The pad nitride layer may be blanket deposited onto the substrate 1902 prior to formation of the fins 1904. The fins are divided into two subsets: first subset 1909A and second subset 1909B. Each fin subset has a fin pitch P. The first subset 1909A and second subset 1909B are separated by a distance W. In some embodiments, W may be equal to P. In other embodiments, W may be larger than P. In this case, some fins may be removed in between the first subset of fins and second subset of fins. In some embodiments, the pitch P may range between about 10 nanometers and about 60 nanometers. In some embodiments, the distance W may range from about 10 nanometers to about 200 nanometers.

FIG. 20 is a semiconductor structure 2000 after a subsequent process step of depositing a nitride layer 2008. The nitride layer 2008 may comprise a silicon nitride layer. In some embodiments, the silicon nitride layer is deposited via chemical vapor deposition (CVD), atomic layer deposition (ALD), or other suitable technique.

FIG. 21 is a semiconductor structure 2100 after a subsequent process step of depositing a mask 2110 over first subset of fins 2109A, while second subset of fins 2109B remains uncovered by the mask 2110. In some embodiments mask 2110 may be comprised of photoresist, and formed via industry-standard lithographic and deposition methods. In other embodiments, mask 2110 may comprise oxide.

FIG. 22 is a semiconductor structure 2200 after a subsequent process step of recessing the structure adjacent to the second subset of fins 2209B. The substrate adjacent to the first subset of fins 2209A is not affected by the recess since that area is protected by mask 2210. In some embodiments, a reactive ion etch (RIE) process may be used to perform the recess. The recess is performed to a depth D3. In some embodiments, the depth D3 may range from about 5 nanometers to about 50 nanometers.

FIG. 23 is a semiconductor structure 2300 after a subsequent process step of removing the mask (compare with 2210 of FIG. 22).

FIG. 24 is a semiconductor structure 2400 after a subsequent process step of depositing an oxide layer 2420, and then planarizing the oxide layer to the level of the top of semiconductor structure 2400. The oxide layer may be deposited via a chemical vapor deposition (CVD) process. The planarization may be performed with a chemical mechanical polish (CMP) process.

FIG. 25 is a semiconductor structure 2500 after a subsequent process step of performing an oxidation process. In some embodiments, the semiconductor structure 2500 is subject to an anneal at a temperature ranging from about 900 degrees Celsius to 1300 degrees Celsius, causing oxygen to diffuse into the substrate, forming oxide regions 2522, which include an oxide region formed within the semiconductor substrate below the second set of fins 2509B. However, oxygen is substantially blocked by nitride layer 2508, so the fins 2504 do not get oxidized. Furthermore, due to the nitride layer 2508B at the base of the first subset of fins 2509A, oxide does not form under the first subset of fins 2509A, whereas oxide does form under the second subset of fins 2509B. Hence, the fins of first subset of fins 2509A are bulk-type fins, and the fins of second subset of fins 2509B are semiconductor-on-insulator (SOI) type fins. Therefore, with embodiments of the present invention, it is possible to fabricate semiconductor devices having both types of fins on a single integrated circuit, which provides added flexibility for circuit designers.

FIG. 26 is a semiconductor structure 2600 in accordance with an alternative embodiment of the present invention. The oxide is recessed to the base of the fins (compare with 2520 of FIG. 25). This recessing may be performed via a reactive ion etch (RIE) process. The nitride layer and pad nitride are also removed (compare with 1906 of FIGS. 19 and 2008 of FIG. 20). The nitride layer and pad nitride may be removed with a wet etch. In some embodiments, an etchant of phosphoric acid is used.

FIG. 27 is a semiconductor structure 2700 in accordance with an alternative embodiment of the present invention. Semiconductor structure 2700 is similar to semiconductor structure 2600. A finFET 2741 is formed on the second subset of fins 2709B. FinFET 2741 comprises a dielectric layer 2731 disposed on the fins of the second subset of fins 2709B. In some embodiments, the dielectric layer 2731 may be a high-K dielectric layer, and may include, but is not limited to: hafnium silicate (HfSiO), hafnium oxide (HfO$_2$), zirconium silicate (ZrSiO$_x$), zirconium oxide (ZrO$_2$), silicon oxide (SiO$_2$), silicon nitride (Si$_3$N$_4$), silicon oxynitride (SiON), or any other high-k material (k>4.0) or any combination of these materials. FinFET 2741 further comprises gate region 2729. In some embodiments, gate region 2729 is comprised of polysilicon. In other embodiments, gate region 2729 is a replacement metal gate (RMG), and may be comprised of a metal such as aluminum, titanium nitride (TiN) or ruthenium (Ru) for a pFET, or titanium aluminum (TiAl), aluminum nitride (AlN) or tantalum carbide (TaC) for an nFET.

The fins of the first subset of fins 2709A and adjacent substrate can be N-doped to make well 2725 an N-well, for example by implanting the substrate with phosphorus or arsenic. A semiconductor region 2727 may be p-doped, and may be formed on the fins of the first subset of fins 2709A to form a fin diode 2743. In some embodiments, semiconductor region 2727 is an in-situ doped epitaxial region comprising boron dopants. Alternatively, the fins of the first subset of fins 2709A and adjacent substrate can be P-doped to make well 2725 a P-well, for example by implanting the substrate with boron. In this case, an N-doped semiconductor region 2727 may be formed on the fins of the first subset of fins 2709A to form a fin diode 2743. In some embodiments, semiconductor region 2727 is an in-situ doped epitaxial region comprising phosphorus or arsenic dopants. Hence, semiconductor structure 2700 comprises a SOI-type finFET, having oxide region 2722 disposed below it, and a bulk-type fin diode 2743, having no oxide region disposed below it.

FIG. 28 is a semiconductor structure 2800 in accordance with an alternative embodiment of the present invention. Semiconductor structure 2800 comprises a set of bulk-type fins 2809A and a set of SOI-type fins 2809B, similar to semiconductor structure 2600 of FIG. 26. However, semiconductor structure 2800 further comprises a planar region 2811. In some embodiments, the planar region 2811 has a width X1 ranging from 10 to 30 times larger than the fin width X2. In some embodiments, fin width X2 ranges from about 5 nanometers to about 20 nanometers. In some embodiments, planar region 2811 has a width X1 ranging from about 100 nanometers to about 1000 nanometers. Oxide regions 2822 are formed in a manner similar to as described for FIGS. 19-26, by depositing an oxide layer into a recessed area, and subsequently performing an anneal to diffuse oxygen into the substrate 2802. The planar region 2811 may be formed using industry-standard patterning techniques.

FIG. 29A is a semiconductor structure 2900 in accordance with an alternative embodiment of the present invention. Semiconductor structure 2900 comprises a set of bulk-type fins 2909A, a set of SOI-type fins 2909B, and a planar region 2911, similar to semiconductor structure 2800 of FIG. 28. Gate dielectric 2931 and gate region 2929 is deposited over the fins of first subset of fins 2909A and second subset of fins 2909B. This forms a SOI-type finFET 2941 and a bulk-type finFET 2945 on substrate 2902. An N-well 2933 is formed by adding N-type dopants to substrate 2902. This may be accomplished via ion implantation or other suitable technique. A p-doped semiconductor region 2927 is disposed on planar region 2911, which forms a planar diode 2947. The planar diode 2947 is well-suited for applications such as electrostatic discharge (ESD) protection. In some embodiments, semiconductor region 2927 is an in-situ doped epitaxial region comprising boron dopants. Hence, semiconductor structure 2900 comprises a SOI-type finFET 2941, having oxide region 2922 disposed below it, a bulk-type finFET 2945 having no oxide region disposed below it, and a planar diode 2947.

FIG. 29B is a semiconductor structure 2950 in accordance with an alternative embodiment of the present invention. Semiconductor structure 2950 of FIG. 29B is similar to semiconductor structure 2900 of FIG. 29A, but differs in that a transistor 2949 is formed on planar region 2911 instead of a planar diode.

Various other embodiments of the present invention are possible. For example, a MOS capacitor or finFET can be formed on the bulk-type fins 2909A. The planar diode 2947 may be of a p-n type, as shown in FIG. 29, or alternatively, of an n-p type, where semiconductor region 2927 is doped with N-type dopants, such as arsenic or phosphorous, and well 2933 is a P-well, and may be doped with boron dopants. In other embodiments, a planar MOS capacitor may be formed on planar region 2911. In still other embodiments, the sidewalls of the planar region 2911 are not exposed. This may be accomplished by using a mask over the planar region (similar in concept to mask 2110 of FIG. 21), to prevent recessing adjacent to the planar region 2911 during fabrication.

FIG. 30 is a flowchart 3000 indicating process steps for embodiments of the present invention. In process step 3050, fins are formed on a bulk substrate (see 1900 of FIG. 19). In process step 3052, a conformal nitride layer is deposited on the semiconductor structure (see 2008 of FIG. 20). In process step 3054, a mask is deposited on a first subset of fins (see 2110 of FIG. 21). In process step 3056, the substrate is recessed in the area adjacent to the second subset of fins (see D3 of FIG. 22). In process step 3058, the mask from process step 3054 is removed (see 2300 of FIG. 23). In process step 3060, an oxide layer is deposited on the semiconductor structure (see 2420 of FIG. 24). In process step 3062, an anneal is performed on the semiconductor structure to form oxide regions below the second subset of fins (see 2522 of FIG. 25). In process step 3064, the oxide is recessed to the level of the base of the fins (see 2622 of FIG. 26). The nitride layers (2008 of FIGS. 20 and 1906 of FIG. 19) are also removed.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A semiconductor structure comprising:
   a semiconductor substrate;
   a first set of fins formed on the semiconductor substrate;

a second set of fins formed on the semiconductor substrate;
an oxide region formed within the semiconductor substrate below the second set of fins;
a bulk-type fin diode formed on the first set of fins; and
a SOI-type finFET formed on the second set of fins.

2. The semiconductor structure of claim 1, further comprising a planar region disposed on the semiconductor substrate.

3. The semiconductor structure of claim 1, wherein the first set of fins are N-doped, and further comprising:
a p-doped semiconductor region disposed on the first set of fins;
a dielectric layer disposed over the second set of fins; and
a metal gate disposed over the dielectric layer.

4. The semiconductor structure of claim 3, wherein the dielectric layer comprises hafnium oxide.

5. The semiconductor structure of claim 1, wherein the first set of fins are P-doped, and further comprising:
an n-doped semiconductor region disposed on the first set of fins;
a dielectric layer disposed over the second set of fins; and
a metal gate disposed over the dielectric layer.

6. A semiconductor structure comprising:
a semiconductor substrate;
a first set of fins formed on the semiconductor substrate;
a second set of fins formed on the semiconductor substrate; and
an oxide region formed within the semiconductor substrate below the second set of fins;
a planar region disposed on the semiconductor substrate;
a bulk-type finFET formed on the first set of fins;
a SOI-type finFET formed on the second set of fins; and
a diode formed on the planar region.

7. A semiconductor structure comprising:
a semiconductor substrate;
a first set of fins formed on the semiconductor substrate;
a second set of fins formed on the semiconductor substrate, wherein the first set of fins and second set of fins have a fin width;
an oxide region formed within the semiconductor substrate below the second set of fins; and
a planar region disposed on the semiconductor substrate, wherein the planar region has a width ranging from 10 to 30 times larger than the fin width;
a bulk-type finFET formed on the first set of fins;
a SOI-type finFET formed on the second set of fins; and
a diode formed on the planar region.

8. The semiconductor structure of claim 7, further comprising a second oxide region disposed within the semiconductor substrate between the planar region and the first set of fins.

9. A semiconductor structure comprising:
a semiconductor substrate;
a first set of fins formed on the semiconductor substrate;
a second set of fins formed on the semiconductor substrate, wherein the first set of fins and second set of fins have a fin width;
an oxide region formed within the semiconductor substrate below the second set of fins; and
a planar region disposed on the semiconductor substrate, wherein the planar region has a width ranging from 10 to 30 times larger than the fin width;
a bulk-type finFET formed on the first set of fins;
a SOI-type finFET formed on the second set of fins; and
a transistor formed on the planar region.

\* \* \* \* \*